(12) United States Patent
Lius et al.

(10) Patent No.: US 11,687,179 B2
(45) Date of Patent: Jun. 27, 2023

(54) ELECTRONIC DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/403,844

(22) Filed: Aug. 16, 2021

(65) Prior Publication Data

US 2022/0091690 A1  Mar. 24, 2022

(30) Foreign Application Priority Data

Sep. 18, 2020 (CN) .......................... 202010989165.1

(51) Int. Cl.
   *G06F 3/041* (2006.01)
   *G06F 3/044* (2006.01)
   *H10K 59/40* (2023.01)

(52) U.S. Cl.
   CPC .......... *G06F 3/0412* (2013.01); *G06F 3/0443* (2019.05); *H10K 59/40* (2023.02)

(58) Field of Classification Search
   None
   See application file for complete search history.

(56) References Cited

U.S. PATENT DOCUMENTS

| 10,254,902 | B2* | 4/2019 | Lee ........................ G06F 3/0446 |
| 2018/0130857 | A1 | 5/2018 | Lee |
| 2018/0330137 | A1 | 11/2018 | Moon |
| 2019/0034688 | A1 | 1/2019 | Lee |
| 2019/0138131 | A1 | 5/2019 | Kim |
| 2020/0065541 | A1 | 2/2020 | Jung |
| 2022/0147186 | A1* | 5/2022 | Bo ......................... G06F 3/0443 |

FOREIGN PATENT DOCUMENTS

CN    111399693 A   *   7/2020

* cited by examiner

*Primary Examiner* — Duane N Taylor, Jr.
(74) *Attorney, Agent, or Firm* — Winston Hsu

(57) ABSTRACT

An electronic device is provided by the present disclosure, wherein the electronic device includes a base layer, a sensing layer disposed on the base layer and at least two conductive layers disposed on the base layer. The sensing layer includes a plurality of sensing electrodes. The conductive layers respectively include a plurality of signal lines, and each of the signal lines is electrically connected to one of the sensing electrodes.

6 Claims, 18 Drawing Sheets

ELECTRONIC DEVICE

BACKGROUND OF THE DISCLOSURE

1. Field of the Disclosure

The present disclosure relates to an electronic device, and more particularly to an electronic device having wire design.

2. Description of the Prior Art

In recent years, as the requirements of the user for electronic devices have become higher, components in the electronic device, such as sensors, can be disposed under the screen to improve the screen-to-body ratio in the electronic device. In addition, as the resolution of the sensors increases, they can serve as the fingerprint identification elements of the electronic device. However, when the resolution of the sensors increases, the number of the wires electrically connected to the sensors would increase accordingly. Therefore, to adjust the design of the wires to improve the spatial configuration in the electronic device has become an important issue in the electronics industry.

SUMMARY OF THE DISCLOSURE

One of the purposes of the present disclosure is to provide an electronic device including a plurality of sensors and a plurality of wires electrically connected to the sensors, wherein the wires may be disposed in at least two conductive layers, such that the spatial configuration of the electronic device may be improved.

In some embodiment, an electronic device is provided by the present disclosure. The electronic device includes a base layer, a sensing layer disposed on the base layer and at least two conductive layers disposed on the base layer. The sensing layer includes a plurality of sensing electrodes. The conductive layers respectively include a plurality of signal lines, and each of the signal lines is electrically connected to one of the sensing electrodes.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
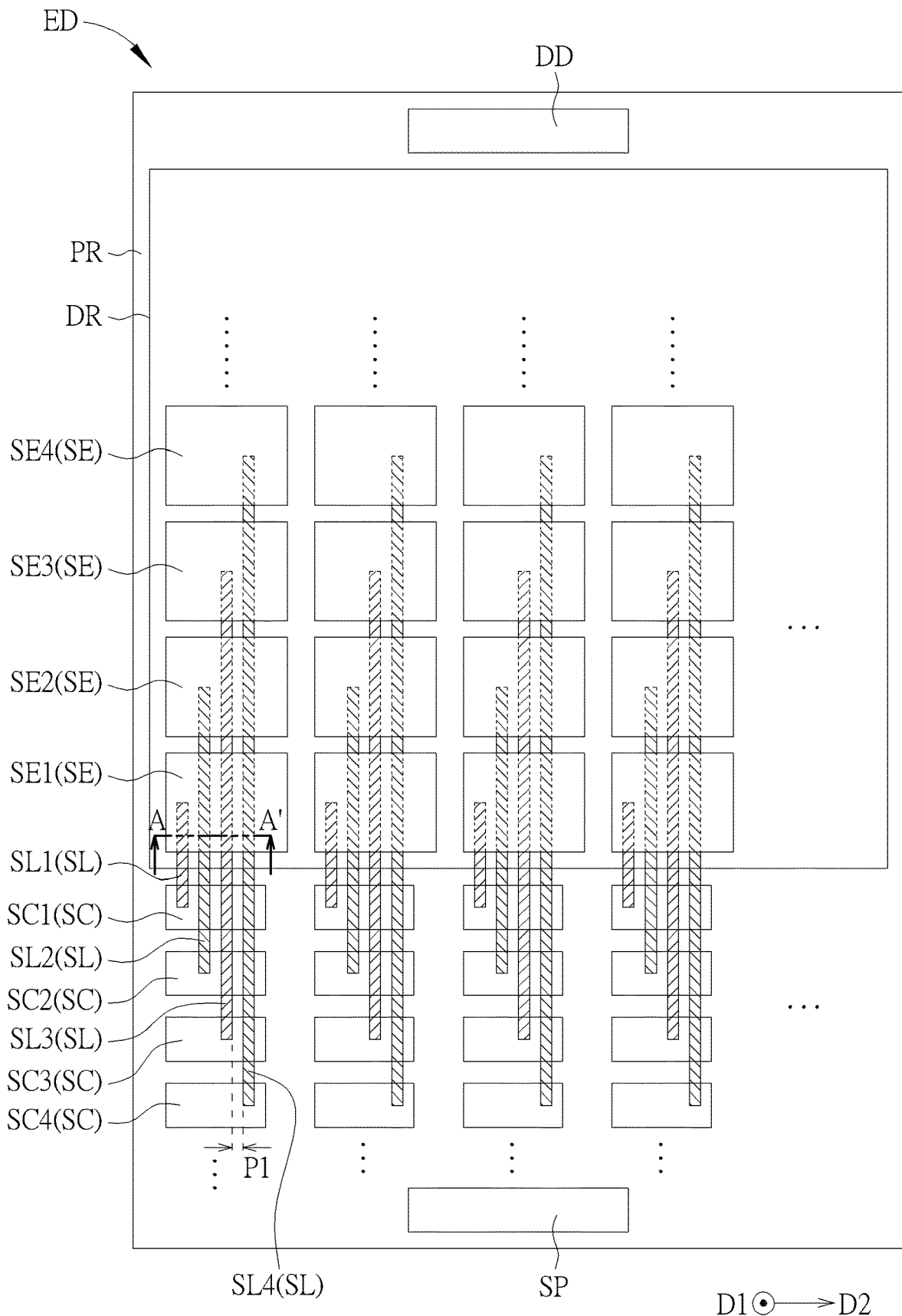
FIG. 1 schematically illustrates a top view of an electronic device according to a first embodiment of the present disclosure.
Figure 2:
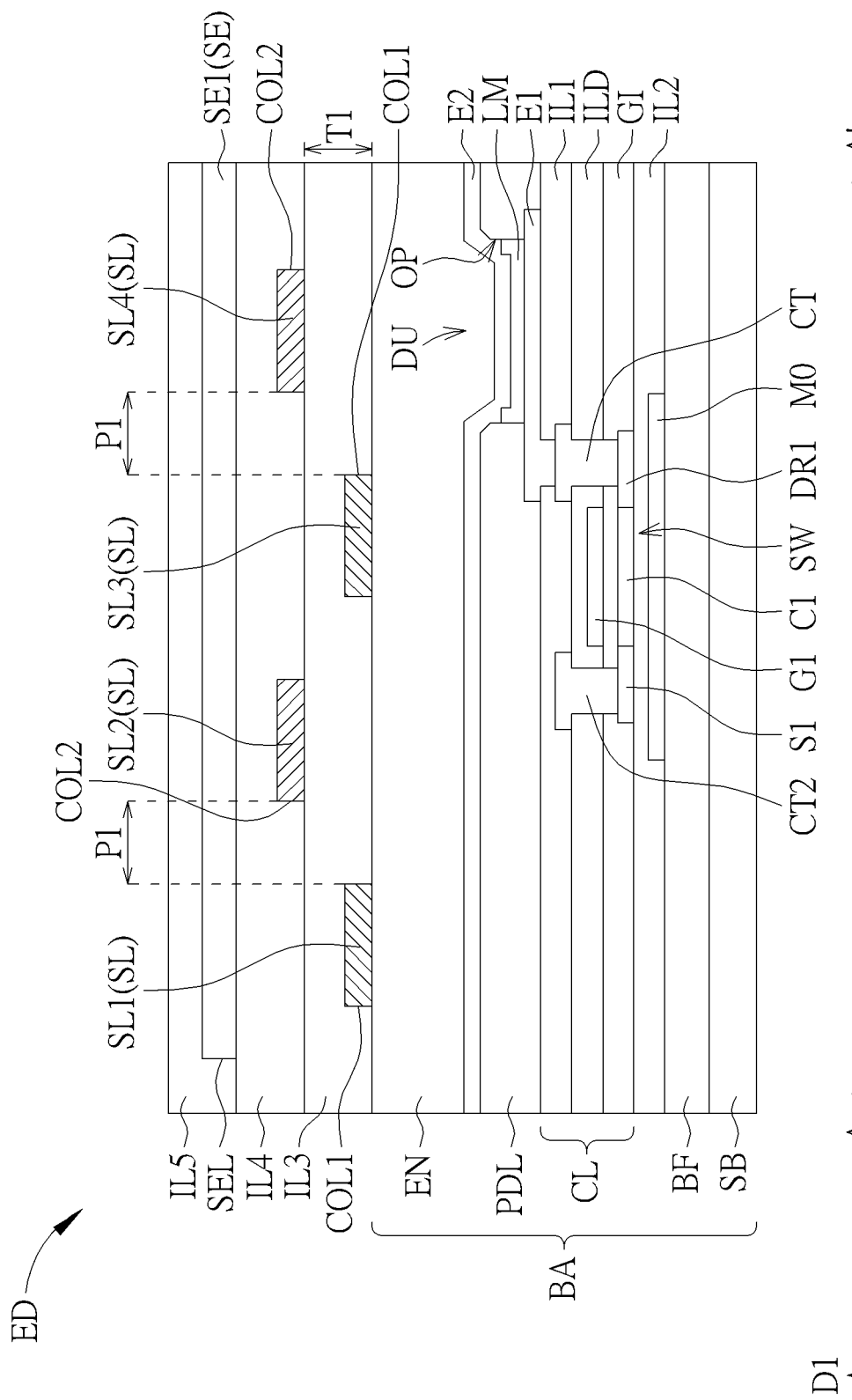
FIG. 2 schematically illustrates a cross-sectional view of the electronic device according to the first embodiment of the present disclosure along a sectional line A-A'.

Referring to FIG. 1 and FIG. 2, FIG. 1 schematically illustrates a top view of an electronic device according to a first embodiment of the present disclosure, and FIG. 2 schematically illustrates a cross-sectional view of the electronic device according to the first embodiment of the present disclosure along a sectional line A-A'. As shown in FIG. 1, the electronic device ED may include display devices which can display static or dynamic images or screens according to the demands and operations of users in the present embodiment, but not limited thereto. The display device may for example be applied to laptops, common displays, tiled displays, vehicle displays, touch displays, television, surveillance cameras, smart phones, tablets, light source modules, light emitting devices or electronic devices of the above-mentioned products, but not limited thereto. As shown in FIG. 2, the electronic device ED may include a base layer BA, wherein the base layer BA may include any suitable display panel, such as a self-luminous display panel, in the present embodiment, but not limited thereto. In some embodiments, the base layer BA may include a non-self-luminous display panel. In addition, the base layer BA may be a flexible display panel or a rigid display panel. In detail, the base layer BA may include a substrate SB, a circuit layer CL, light emitting unit(s) DU, a buffer layer BF, a pixel defining layer PDL and an encapsulation layer EN, but not limited thereto. The substrate SB may include a flexible substrate, a rigid substrate or the combination of the above-mentioned substrates. The material of the flexible substrate may for example include polyimide (PI), polycarbonate (PC), polyethylene terephthalate (PET), other suitable materials or the combinations of the above-mentioned materials. The material of the rigid substrate may for example include glass, ceramic, quartz, sapphire or the combinations of the above-mentioned materials. In addition, although the substrate SB shown in FIG. 2 is a single layer structure, the present disclosure is not limited thereto. In some embodiments, the substrate SB may include a multi-layer structure. The circuit layer CL may be disposed on the substrate SB, for example, may be disposed between the substrate SB and the light emitting unit (s) DU. The circuit layer CL may include various kinds of wires, circuits and/or electronic elements. For example, as shown in FIG. 2, the circuit layer CL may include driving element(s) SW, wherein the driving element(s) SW may for example include thin film transistors (TFT), but the present disclosure is not limited thereto. The driving element SW may include a gate G1, a source S1, a drain DR1, a semiconductor layer C1 and a gate insulating layer GI, wherein the gate insulating layer GI may be disposed between the gate G1 and the semiconductor layer C1, but not limited thereto. The material of the semiconductor layer C1 may for example include amorphous silicon, poly-crystalline silicon, metal oxides (such as indium gallium zinc oxide (IGZO)), other suitable conductive materials or the combinations of the above-mentioned materials, but not limited thereto. The gate G1 may for example include metal materials, other suitable conductive materials or the combinations of the above-mentioned materials, but not limited thereto. The source S1 and the drain DR1 may for example include doped amorphous materials, doped poly-crystalline materials, metal oxides, metal materials, other suitable conductive materials or the combinations of the above-mentioned materials, but not limited thereto. The gate insulating layer GI may for example include silicon nitride, silicon oxide, other suitable insulating materials, dielectric materials or the combinations of the above-mentioned materials, but not limited thereto. It should be noted that although the driving element SW shown in FIG. 2 is a top-gate type thin film transistor, the present disclosure is not limited thereto. In some embodiments, the driving element(s) SW may for example include bottom-gate type thin film transistors or multi-gate type thin film transistors (such as dual-gate type/double-gate type thin film transistors). According to the present embodiment, the light emitting unit(s) DU may be disposed on the circuit layer CL, and the light emitting unit(s) DU may for example include light emitting diodes, but not limited thereto. In some embodiments, when the base layer BA includes the non-self-luminous display panel such as the liquid crystal display panel, the electronic device ED may for example include light modulating units (such as a liquid crystal layer, but not limited thereto) disposed on the circuit layer CL instead of the light emitting unit DU disposed on the circuit layer CL, and the electronic device ED may further include a backlight module disposed under the substrate SB, but not limited thereto. The light emitting diode may for example include an organic light emitting diode (OLED), a quantum light-emitting diode (QLED or QDLED), a light emitting diode (LED), any other suitable light emitting element or the combinations of the above-mentioned materials. The light emitting diode may for example include a mini light emitting diode (mini LED) or a micro light emitting diode (micro LED), but not limited thereto. In some embodiments, the chip size of the light emitting diode may range from 300 micrometers (μm) to 10 millimeters (mm), the chip size of the mini light emitting diode may range from 100 micrometers to 300 micrometers, and the chip size of the micro light emitting diode may range from 1 micrometer to 100 micrometers, but not limited thereto. As shown in FIG. 2, the light emitting unit(s) DU may include a first electrode E1, a second electrode E2 and a light emitting layer LM, wherein the light emitting layer LM may be disposed between the first electrode E1 and the second electrode E2, but not limited thereto. The first electrode E1 and the second electrode E2 may for example include metal oxides, metal materials, other suitable conductive materials or the combinations of the above-mentioned materials, but not limited thereto. For example, the first electrode E1 and the second electrode E2 may include transparent conductive materials such as indium tin oxide (ITO), but not limited thereto. In some embodiments, the electrode of the light emitting unit DU in the non-display side (such as the first electrode E1, but not limited thereto) may include metal materials or may be formed of a metal layer, but not limited thereto. According to the present embodiment, at least one of the light emitting unit(s) DU may be electrically connected to at least one element in the circuit layer CL. For example, as shown in FIG. 2, the drain DR1 of the driving element SW of the circuit layer CL may for example be electrically connected to the first electrode E1 of the light emitting unit DU through a contact CT, but not limited thereto. In some embodiments, each of the driving elements SW may be electrically connected to corresponding one of the light emitting units DU. In addition, the source S1 of the driving element SW may be electrically connected to a working voltage source (VDD) or a common voltage source (not shown in FIG. 2) thorough a contact CT2, and the gate G1 of the driving element SW may for example be electrically connected to a switch element (not shown in FIG. 2), wherein the switch element may for example be a thin film transistor, but not limited thereto. The encapsulation layer EN may be disposed on the light emitting unit(s) DU and cover the light emitting unit(s) DU and the layers thereunder to protect the light emitting unit(s) DU. The encapsulation layer EN may include any suitable insulating material such as organic insulating materials, inorganic insulating materials or the combinations of the above-mentioned materials, but not limited thereto. In addition, although the encapsulation layer EN shown in FIG. 2 is a single layer structure, the present embodiment is not limited thereto. In some embodiments, the encapsulation layer EN may include a three-layer structure formed of an inorganic layer, an organic layer and an inorganic layer.

In some embodiments, the base layer BA may further include a buffer layer BF, alight shielding layer M0 and a pixel defining layer PDL, but not limited thereto. The buffer layer BF may be disposed between the substrate SB and the circuit layer CL. The light shielding layer M0 may be disposed on the substrate SB, and in a top view direction (such as the direction D1) of the electronic device ED, the light shielding layer M0 may be located between the circuit layer CL and the substrate SB. In detail, the light shielding layer M0 may for example be disposed between the substrate SB and the driving element SW to block the light entering from the side of the substrate SB, such that the effect of ambient light on the driving element SW may be reduced, but not limited thereto. The pixel defining layer PDL may include at least one opening OP, and the light emitting layer LM of the light emitting unit DU may be disposed in the opening. In some embodiments, because the light emitting layer LM may be disposed in the opening OP, the light emitting region or the light emitting area of each of the light emitting units DU may be defined by the opening OP of the pixel defining layer PDL, but not limited thereto. In addition, the base layer BA may further include an interlayer dielectric layer ILD disposed on the gate insulating layer GI, an insulating layer IL1 disposed between the circuit layer CL and the light emitting unit DU, and an insulating layer IL2 disposed between the circuit layer CL and the substrate SB in some embodiments, but not limited thereto. The buffer layer BF, the insulating layer IL1, the insulating layer IL2 and the interlayer dielectric layer ILD may for example include inorganic insulating materials, organic insulating materials or the combinations of the above-mentioned materials, such as silicon oxide, silicon nitride, silicon oxynitride or other suitable materials, but not limited thereto. It should be noted that the structure of the base layer BA shown in FIG. 2 is just exemplary, and the present disclosure is not limited thereto. In some embodiments, the base layer BA may have any suitable structure or include any suitable element or layer according to the demands of the design. In addition, the descriptions of the base layer BA in the following embodiments may refer to the contents of the present embodiment, and will not be redundantly described in the following.

According to the present embodiment, as shown in FIG. 1, the electronic device ED may include a display region DR and a peripheral region PR, wherein the display region DR may for example be defined by the distribution area of the plural pixels in the electronic device ED. In detail, each of the pixels or sub-pixels (denoted as pixel hereinafter) in the electronic device ED may for example be defined through the pixel defining layer PDL shown in FIG. 2, wherein each of the pixels may correspond to a light emitting unit DU and the driving element SW and other related elements corresponding to the light emitting unit DU, but not limited thereto. In some embodiments, when the base layer BA includes the non-self-luminous display panel, a pixel may for example correspond to a light modulating unit and a driving element SW and other related elements corresponding to the light modulating unit. In the present embodiment, the display region DR may for example be defined as the region enclosed by the outer edge of the outermost pixels among the plurality of pixels, and the region other than the display region DR may be defined as the peripheral region PR, but not limited thereto. The display region DR may for example correspond to the light emitting region of the electronic device ED, and the peripheral region PR may be used for disposition of peripheral elements and/or peripheral circuits, but not limited thereto. The definitions of the display region DR and the peripheral region PR mentioned above may be applied to each of the embodiments and variant embodiments of the present disclosure, and will not be redundantly described in the following. In addition, the size of the display region DR and the size of the peripheral region PR shown in FIG. 1 are just exemplary, and the present disclosure is not limited thereto.

According to the present embodiment, the electronic device ED may further include a sensing layer in addition to the elements or the layers mentioned above. In detail, as shown in FIG. 2, the electronic device ED may include a sensing layer SEL, wherein the sensing layer SEL may be disposed on the base layer BA, but not limited thereto. It should be noted that "the sensing layer is disposed on the base layer BA" mentioned above may represent that the sensing layer SEL is directly disposed on the base layer BA with physical contact therebetween, or intervening layers may be represented between the sensing layer SEL and the base layer BA, and the present disclosure is not limited thereto. In the present embodiment, as shown in FIG. 1 and FIG. 2, the sensing layer SEL includes a plurality of sensing electrodes SE (such as the sensing electrode SE1, the sensing electrode SE2, the sensing electrode SE3 and the sensing electrode SE4), wherein the sensing electrodes SE may for example be disposed in the display region DR, but not limited thereto. An insulating layer IL5 may be disposed on the sensing layer SEL, wherein the insulating layer IL5 may cover the sensing layer SEL, but not limited thereto. The sensing electrodes SE may for example include transparent electrodes, wherein the material of the transparent electrodes may for example include indium tin oxide, indium zinc oxide (IZO) or the combination of the above-mentioned materials, but not limited thereto. According to the present embodiment, the sensing electrodes SE of the electronic device ED may for example serve as touch elements, but not limited thereto. For example, the sensing electrodes SE may serve as capacitive touch elements, and when an object (such as finger) touches the surface of the electronic device ED, the sensing electrode SE corresponding to the contact position of the object may detect the change in capacitance value, thereby obtaining the touch position of the object on the surface of the electronic device ED, but not limited thereto. In some embodiments, when the density of the sensing electrodes SE is greater, or the resolution of the sensing electrodes SE is higher, because the ridges and the valleys of the finger of human body would affect the capacitance value in different degrees, the signals output from the sensing electrodes SE may be different, and therefore the fingerprint identification may be performed through the sensing electrodes SE. That is, the sensing electrodes SE may for example serve as capacitive fingerprint identification elements, but not limited thereto. In some embodiments, the density of the sensing electrodes SE of the electronic device ED may be different in different regions, wherein a portion of the sensing electrodes SE with greater density may serve as the fingerprint identification elements, and another portion of the sensing electrodes SE may serve as touch elements, but not limited thereto. "The density of the sensing electrodes SE" mentioned above may for example be defined as the number of the sensing electrodes SE in an unit area, but not limited thereto. It should be noted that the pattern and the arrangement of the sensing electrodes SE shown in FIG. 1 are just exemplary, and the present disclosure is not limited thereto.

According to the present embodiment, the electronic device ED may further include a plurality of signal lines SL, wherein each of the signal lines SL may for example be connected to corresponding one of the sensing electrodes SE, but not limited thereto. In detail, as shown in FIG. 1, the signal line SL1 may be electrically connected to the sensing electrode SE1, the signal line SL2 may be electrically connected to the sensing electrode SE2, the signal line SL3 may be electrically connected to the sensing electrode SE3, and the signal line SL4 may be electrically connected to the sensing electrode SE4, but not limited thereto. In the present embodiment, as shown in FIG. 1, in order to make the signal lines SL capable of being electrically connected to their corresponding sensing electrodes SE, each of the signal lines SL may for example extend to any suitable position in the corresponding sensing electrode SE in the top view direction (direction D1) of the electronic device ED, and each of the signal lines SL may be electrically connected to the corresponding sensing electrode SE through a via (not shown in FIG. 1), but not limited thereto. The material of the signal lines SL may for example include copper, silver, gold, aluminum, other suitable conductive materials or the combinations of the above-mentioned materials in the present embodiment, but not limited thereto. As mentioned above, the sensing electrodes SE of the present embodiment may for example serve as touch elements or fingerprint identification elements, the signal lines SL electrically connected to the sensing electrodes SE may transmit the signals detected by the sensing electrodes SE to sensing circuits, and a sensing processor may process the output signals of the sensing circuits to recognize the touch position or obtain the pattern of the fingerprint, but not limited thereto. For example, as shown in FIG. 1, the electronic device ED may further include sensing circuits SC and a sensing processor SP, wherein the sensing circuits SC and the sensing processor SP may be disposed in the peripheral region PR of the electronic device ED, but not limited thereto. In the present embodiment, the signal line SL1, the signal line SL2, the signal line SL3 and the signal line SL4 respectively electrically connected to the sensing electrode SE1, the sensing electrode SE2, the sensing electrode SE3 and the sensing electrode SE4 may be electrically connected to the sensing circuit SC1, the sensing circuit SC2, the sensing circuit SC3 and the sensing circuit SC4 respectively, and the signals detected by the sensing electrodes SE may be transmitted to the sensing circuits SC. For example, when the sensing electrodes SE are serve as capacitive touch elements or capacitive fingerprint identification elements, the signal lines SL may transmit the capacitance signals from the sensing electrodes SE to the sensing circuits SC, but not limited thereto. In addition, the sensing circuits SC may be electrically connected to the sensing processor SP (not shown in FIG. 1) in the present embodiment, such that the sensing circuits SC may output corresponding signals to the sensing processor SP after the sensing circuits SC receive the signals from the sensing electrodes SE, but not limited thereto. The sensing processor SP may process the output signals from the sensing circuits SC to recognize the touch position or obtain the pattern of the fingerprint, but not limited thereto. It should be noted that although the shape of the sensing circuits SC shown in FIG. 1 and the following figures is rectangular, the present disclosure is not limited thereto. In some embodiments, the sensing circuits SC may include the circuits formed of any suitable wire or conductive wire.

In the present embodiment, the peripheral region PR of the electronic device ED may further include a display driver DD in addition to the sensing circuits SC and the sensing processor SP, wherein the display driver DD may for example be used to control the driving element(s) SW and drive the light emitting unit(s) DU to control the display function of the electronic device ED, but not limited thereto. In the present embodiment, as shown in FIG. 1, the display driver DD and the sensing circuits SC, and the sensing processor SP may be disposed at two opposite sides of the display region DR to improve the spatial configuration of the electronic device ED, but the present disclosure is not limited thereto. In some embodiments, the display driver DD, the sensing circuits SC and the sensing processor SP may be disposed in any suitable way according to the demands of the design. In some embodiments, the peripheral region PR of the electronic device ED may further include any peripheral element suitable to be applied to the electronic device ED in addition to the above-mentioned elements.

As mentioned above, each of the sensing electrodes SE may be electrically connected to one of the signal lines SL, and the signals detected by the sensing electrodes SE may be transmitted to the sensing circuits SC and the sensing processor SP through the signal lines SL. When the number and/or the density of the sensing electrodes SE are greater, the number and/or the density (for example, the number of the signal lines SL in one unit area, but not limited thereto) of the signal lines SL in the electronic device may increase accordingly. For example, when some of the sensing electrodes SE or all of the sensing electrodes SE in the electronic device ED serve as fingerprint identification elements, the resolution and/or the density of the sensing electrodes SE may be greater, and the number and/or the density of the signal lines SL electrically connected to the sensing electrodes SE may increase accordingly. In such condition, the signal lines SL may interfere with each other (for example, parasitic capacitance may be generated, but not limited thereto) due to the excessive small spacing between the signal lines SL when the signal lines SL are disposed in the same layer, thereby affecting the performance of the electronic device ED. Or, the signal lines SL may occupy a greater portion of the space of the peripheral region PR, such that the spatial configuration of the electronic device ED may be limited. Or, the electronic device ED may not have enough space for disposition of the signal lines SL with a number corresponding to the number of the sensing electrodes SE. Therefore, according to the present embodiment, the electronic device ED may include at least two conductive layers, such as a conductive layer COL1 and a conductive layer COL2, wherein the conductive layer COL1 may include a portion of the signal lines SL electrically connected to a portion of the sensing electrodes SE, and the conductive layer COL2 may include another portion of the signal lines SL electrically connected to another portion of the sensing electrodes SE, thereby increasing the utilization rate of the space of the electronic device ED and/or reducing the interference between the signal lines SL. For example, as shown in FIG. 2, the conductive layer COL1 and the conductive layer COL2 may be disposed on the base layer BA. It should be noted that "the conductive layer is disposed on the base layer" mentioned above may represent that the conductive layer may be directly disposed on the base layer BA and is in physical contact with the base layer BA, or intervening layers may be presented between the conductive layer and the base layer BA, the present disclosure is not limited thereto. In addition, the conductive layer COL1 and the conductive layer COL2 may be the layers located on different planes (such as the planes perpendicular to the direction D1, but not limited thereto) or formed in different steps, but not limited thereto. According to the present embodiment, the sensing layer SEL may be disposed on the conductive layer COL1 and the conductive layer COL2, that is, the conductive layer COL1 and the conductive layer COL2 may be disposed between the sensing layer SEL and the base layer BA, but not limited thereto. An insulating layer IL3 may further be disposed between the conductive layer COL1 and the conductive layer COL2, wherein the insulating layer IL3 covers the conductive layer COL1 and separates the conductive layer COL1 and the conductive layer COL2. An insulating layer IL4 may further be disposed between the sensing layer SEL and the conductive layer COL2, wherein the insulating layer IL4 covers the conductive layer COL2 and separates the conductive layer COL2 and the sensing layer SEL. In some embodiments, the disposition order of the sensing layer SEL, the conductive layer COL1 and the conductive layer COL2 may be different according to the demands of the design. As shown in FIG. 2, the plurality of signal lines SL of the electronic device ED may respectively be included in the conductive layer COL1 and the conductive layer COL2. that is, a portion of the signal lines SL are formed of the conductive layer COL1, another portion of the signal lines SL are formed of the conductive layer COL2, and the conductive layer COL1 and the conductive layer COL2 are the layers in which the signal lines SL are located, but not limited thereto. For example, the signal line SL1 electrically connected to the sensing electrode SE1 and the signal line SL3 electrically connected to the sensing electrode SE3 may be disposed in the conductive layer COL1, and the signal line SL2 electrically connected to the sensing electrode SE2 and the signal line SL4 electrically connected to the sensing electrode SE4 may be disposed in the conductive layer COL2, but the present disclosure is not limited thereto. In some embodiments, the signal lines SL1 and the signal lines SL3 may be disposed in the conductive layer COL2, and the signal lines SL2 and the signal lines SL4 may be disposed in the conductive layer COL1. Since the signal lines SL may be disposed in at least two conductive layers (the conductive layer COL1 and the conductive layer COL2) located on different planes in the present embodiment, the interference between the signal lines SL may be reduced even though the spacing between the adjacent (or the corresponding) signal lines SL in the top view direction is reduced, such that the spatial configuration of the electronic device ED may become more flexible. According to the present embodiment, a signal line SL in a conductive layer and a corresponding signal lines SL in another conductive layer may for example have a spacing in the top view direction (such as the direction D1), wherein the spacing may for example be lower than or equal to 2 micrometers (μm), but not limited thereto. It should be noted that "a signal line SL in a conductive layer and a corresponding signal lines SL in another conductive layer" mentioned above represents that the two signal lines SL are adjacent to each other, and no signal line SL is included between the two signal lines SL. That is, the spacing mentioned above is the shortest spacing between two adjacent signal lines SL in the top view direction, and the spacing may for example be measured along the direction perpendicular to the extending direction of the signal lines SL, but not limited thereto. For example, as shown in FIG. 2, the signal line SL2 in the conductive layer COL2 may correspond to the closest signal line SL in the conductive layer COL1, such as the signal line SL1 (or the signal line SL3), and the signal line SL4 may correspond to the signal line SL3, but not limited thereto. It should be noted that when a signal line SL is said to be corresponding to another signal line SL in the following, the definition of "corresponding" may refer to the contents mentioned above, and will not be redundantly described. As shown in FIG. 2, a spacing P1 may be included between the signal line SL2 and the signal line SL1 corresponding to the signal line SL2, and the spacing P1 may be included between the signal line SL4 and the signal line SL3 corresponding to the signal line SL4, but not limited thereto. According to the present embodiment, as mentioned above, the spacing P1 may be lower than or equal to 2 micrometers, but not limited thereto. In some embodiments, the spacing between the signal line SL2 and the signal line SL1 corresponding to the signal line SL2 and the spacing between the signal line SL4 and the signal line SL3 corresponding to the signal line SL4 may be different. In some embodiments, the signal line SL2 may correspond to the signal line SL3, and the spacing P1 which is lower than or equal to 2 micrometers may be included between the signal line SL2 and the signal line SL3, but not limited thereto. In addition, the vertical distance (or the distance along the direction D1) between two adjacent signal lines SL or two corresponding signal lines SL may be increased through the design of the thickness of the insulating layer IL3 in the present embodiment, thereby reducing the interference between the two signal lines SL, but not limited thereto. For example, as shown in FIG. 2, the insulating layer IL3 may have a thickness T1, and when the thickness T1 is greater, the vertical distance between the signal lines SL (for example, the vertical distance between the signal line SL1 and the signal line SL2 and/or the vertical distance the signal line SL3 and the signal line SL4) may increase accordingly. According to the present embodiment, the thickness T1 of the insulating layer IL3 may for example range from 2000 angstroms (Å) to 4000 angstroms, but not limited thereto. The thickness T1 mentioned above may represent the distance between the bottommost surface and the uppermost surface of the insulating layer IL3, and will not be redundantly described in the following. In some embodiments, the thickness T1 of the insulating layer IL3 may for example range from 5000 angstroms to 25000 angstroms. It should be noted that the thickness of the insulating layer IL4 and the thickness of the insulating layer IL3 may be the same or different in the present embodiment, and the present disclosure is not limited thereto. In addition, although FIG. 2 only shows the electronic device ED including two conductive layers, the present disclosure is not limited thereto. In some embodiments, the electronic device ED may include three or more conductive layers, and the signal lines SL may be disposed in these conductive layers in any suitable way according to the demands of the design. In some embodiments, each of the conductive layers may be matched with an insulating layer, but not limited thereto. The above-mentioned feature about the number of the conductive layers included in the electronic device ED may be applied to each of the embodiments and variant embodiments of the present disclosure, and will not be redundantly described in the following. According to the present embodiment, since the signal lines SL of the electronic device ED may be disposed in different conductive layers, and the vertical distance between the adjacent signal lines SL or the corresponding signal lines SL may be controlled by adjusting the thickness of the insulating layer (such as the insulating layer IL3 shown in FIG. 2) between the conductive layers, compared with the condition that the signal lines are disposed in the same layer, the spacing (such as the spacing P1) between the signal lines SL in a lateral direction D2 may be lower in the present embodiment, such that the spatial configuration of the electronic device ED may be improved under the condition that the interference between the signal lines SL is reduced.

Other embodiments of the present disclosure will be described in the following. In order to simplify the description, the same elements or layers in the following embodiments would be labeled with the same symbol, and the features thereof will not be redundantly described. The differences between the embodiments will be detailed in the following.

Figure 3:
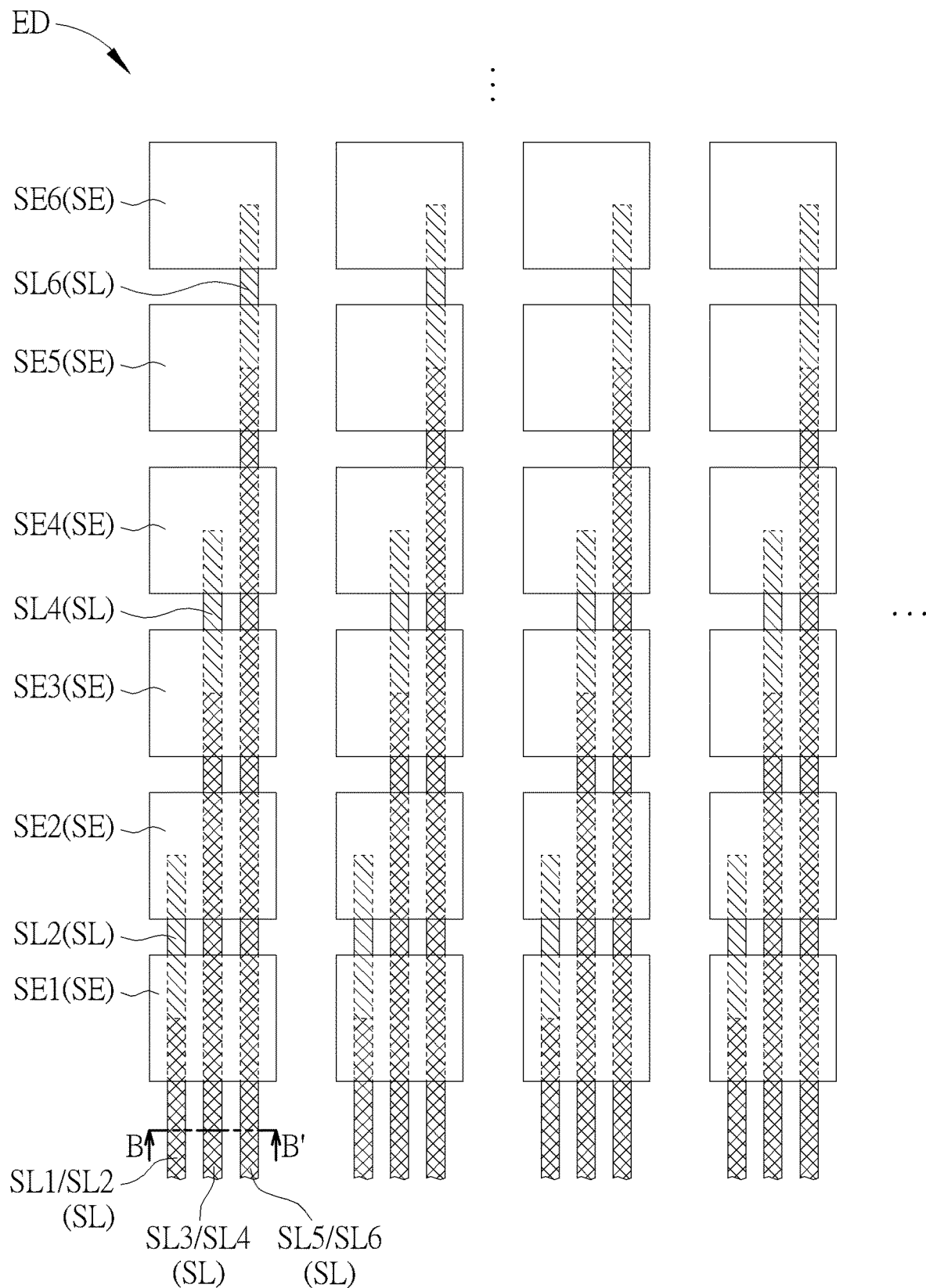
FIG. 3 schematically illustrates a top view of an electronic device according to a second embodiment of the present disclosure.
Figure 4:
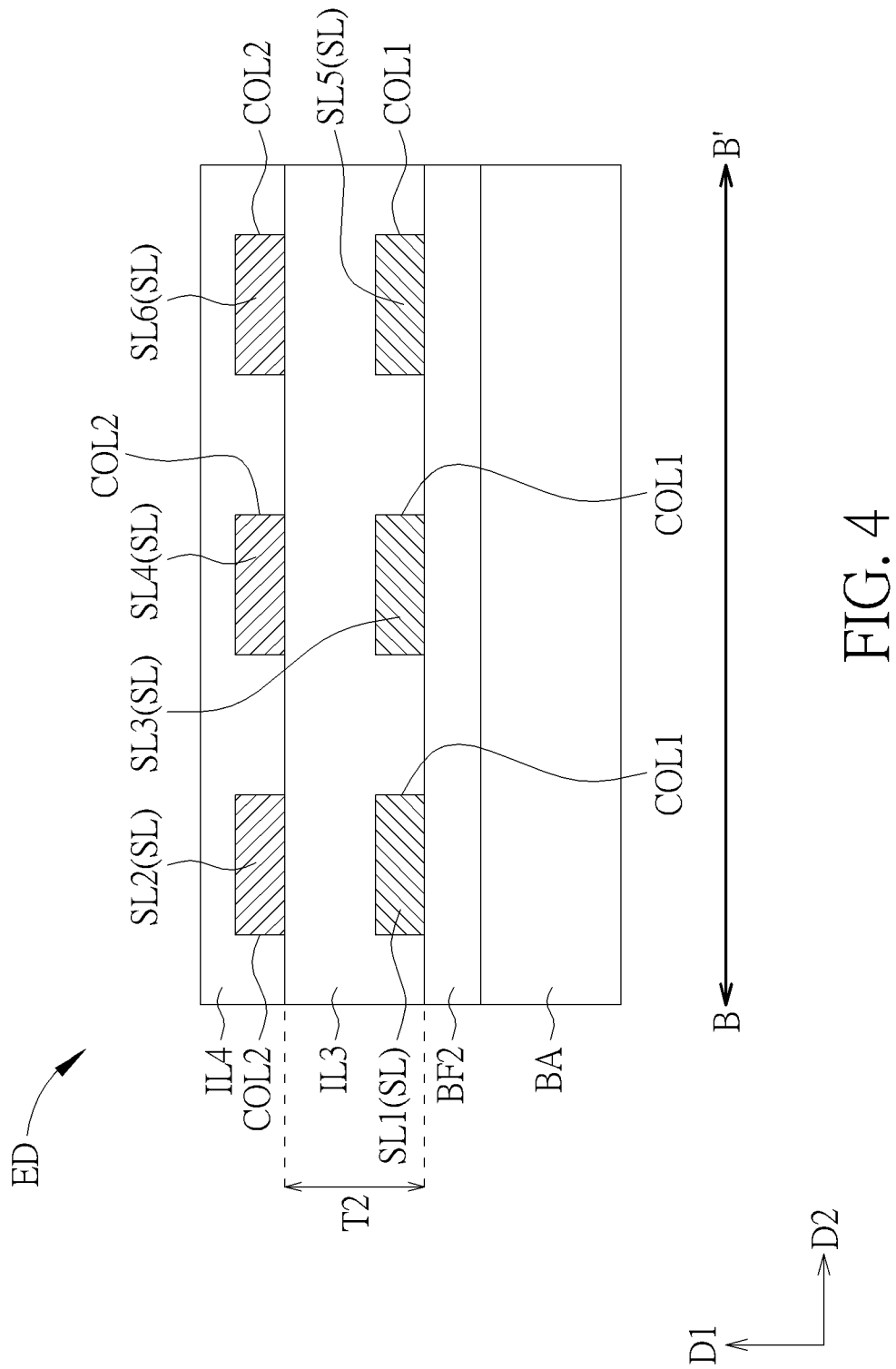
FIG. 4 schematically illustrates a cross-sectional view of the electronic device according to the second embodiment of the present disclosure along a sectional line B-B'.

Referring to FIG. 3 and FIG. 4, FIG. 3 schematically illustrates a top view of an electronic device according to a second embodiment of the present disclosure, and FIG. 4 schematically illustrates a cross-sectional view of the electronic device according to the second embodiment of the present disclosure along a sectional line B-B'. In order to simplify the figure, FIG. 3 only shows the signal lines SL and the sensing electrodes SE, and other elements and layers are omitted. In addition, the base layer BA in FIG. 4 is shown as a single layer, and the elements and the layers included in the base layer BA may refer to the contents in the above-mentioned first embodiment, and will not be redundantly described. The material of the signal lines SL and the material of the sensing electrodes SE of the present embodiment may refer to the contents of the above-mentioned first embodiment, and will not be redundantly described. One of the main differences between the structure shown in FIG. 3 and the structure of the first embodiment shown in FIG. 1 is the design of the signal lines SL. According to the present embodiment, the signal lines SL may be disposed in at least two conductive layers, and the signal lines SL located in one of the at least two conductive layers may for example be overlapped with the corresponding signal lines SL located in another one of the at least two conductive layers in the top view direction, but not limited thereto. In detail, as shown in FIG. 3 and FIG. 4, the electronic device ED of the present embodiment may include two conductive layers (conductive layer COL1 and conductive layer COL2), and the two conductive layers include the signal line SL1, the signal line SL2, the signal line SL3, the signal line SL4, the signal line SL5 and the signal line SL6 respectively electrically connected to the sensing electrode SE1, the sensing electrode SE2, the sensing electrode SE3, the sensing electrode SE4, the sensing electrode SE5 and the sensing electrode SE6, wherein the signal line SL1, the signal line SL3 and the signal line SL5 may be included in the conductive layer COL1, and the signal line SL2, the signal line SL4 and the signal line SL6 may be included in the conductive layer COL2, but not limited thereto. In addition, as shown in FIG. 3 and FIG. 4, the signal line SL1 may be overlapped with the corresponding signal line SL2 in the direction D1, the signal line SL3 may be overlapped with the corresponding signal line SL4 in the direction D1, and the signal line SL5 may be overlapped with the corresponding signal line SL6 in the direction D1, but not limited thereto. Since the signal lines SL may be disposed in different conductive layers in the present embodiment, the signal lines SL in different conductive layers may be overlapped with each other, such that the spatial configuration of the electronic device ED may be improved. For example, the configuration space of the signal lines SL may be saved, or the number of the signal lines SL disposed in the electronic device ED may be increased, but not limited thereto. In addition, the interference between the signal lines SL may be reduced by adjusting the thickness of the insulating layer between the conductive layers in the present embodiment. For example, as shown in FIG. 4, the insulating layer IL3 may have a thickness T2 in the present embodiment, wherein the thickness T2 may for example range from 5000 angstroms to 25000 angstroms, but not limited thereto. In the present embodiment, the thickness of the insulating layer IL3 may for example be greater than the thickness of the insulating layer IL4, but not limited thereto. Since the insulating layer IL3 may have a greater thickness in the present embodiment, the interference between two signal lines SL which are overlapped with each other may be reduced, thereby improving the performance of the electronic device ED. It should be noted that although the signal line SL1 is completely overlapped with the signal line SL2, the signal line SL3 is completely overlapped with the signal line SL4, and the signal line SL5 is completely overlapped with the signal line SL6 in the structure shown in FIG. 4, the present disclosure is not limited thereto. In some embodiments, the signal line SL1 may be partially overlapped with the corresponding signal line SL2, the signal line SL3 may be partially overlapped with the corresponding signal line SL4, and the signal line SL5 may be partially overlapped with the corresponding signal line SL6. In addition, in some embodiments, a buffer layer BF2 may be included between the base layer BA and the conductive layer COL1, as shown in FIG. 4, but the present disclosure is not limited thereto. The material of the buffer layer BF2 may refer to the material of the buffer layer BF in the above-mentioned first embodiment, and will not be redundantly described.

Figure 5:
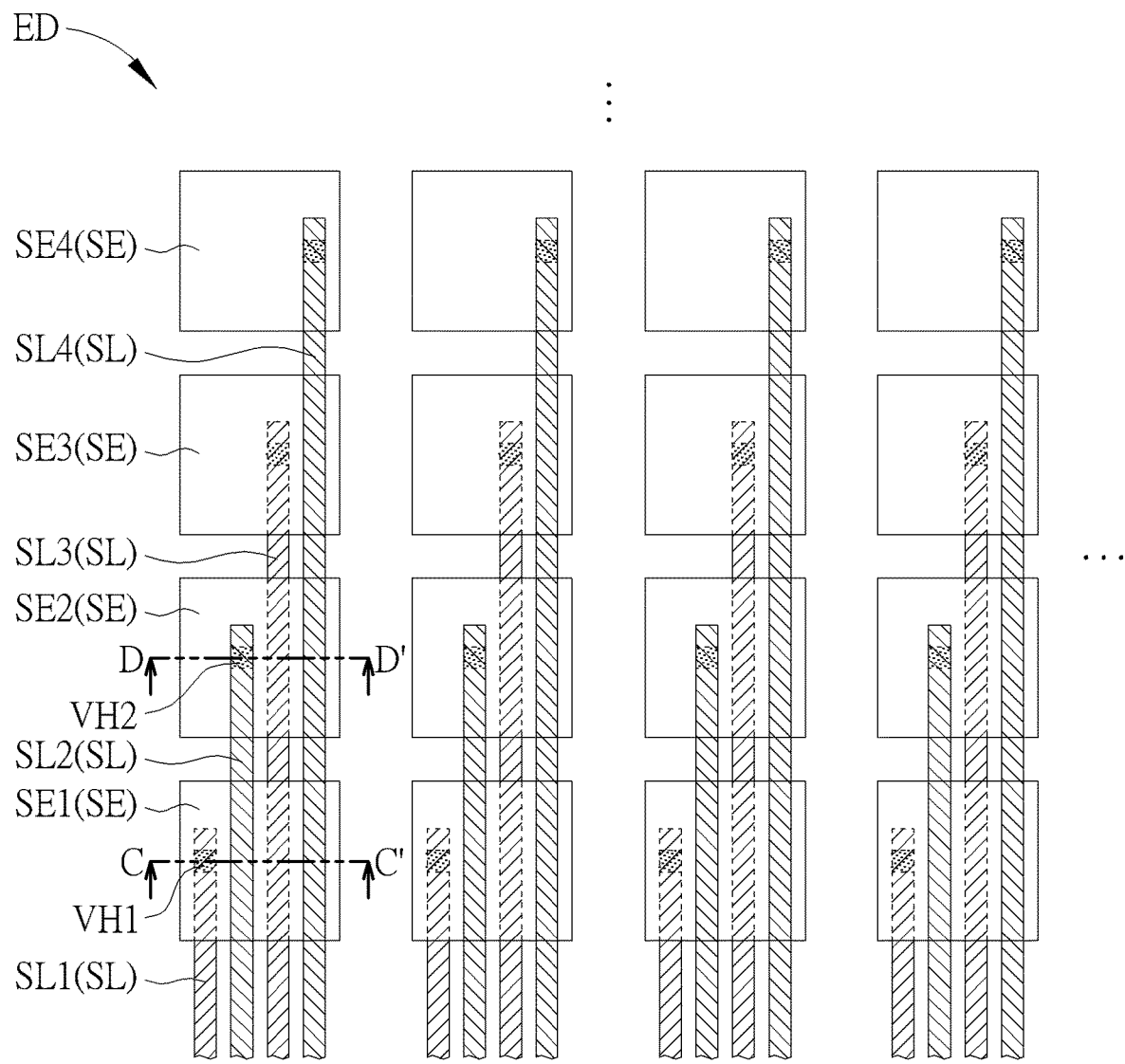
FIG. 5 schematically illustrates a top view of an electronic device according to a third embodiment of the present disclosure.
Figure 6:
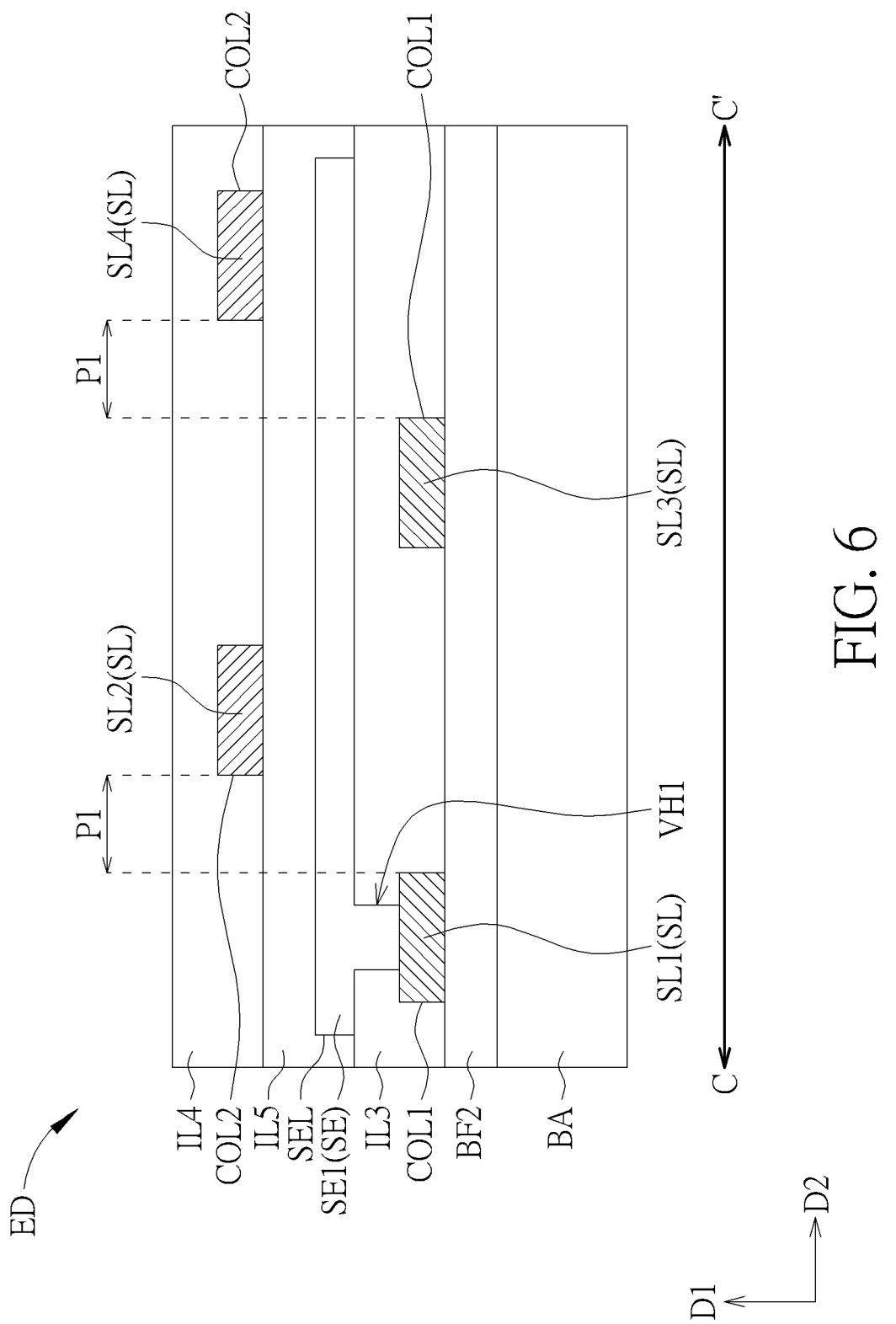
FIG. 6 schematically illustrates a cross-sectional view of the electronic device according to the third embodiment of the present disclosure along a sectional line C-C'.
Figure 7:
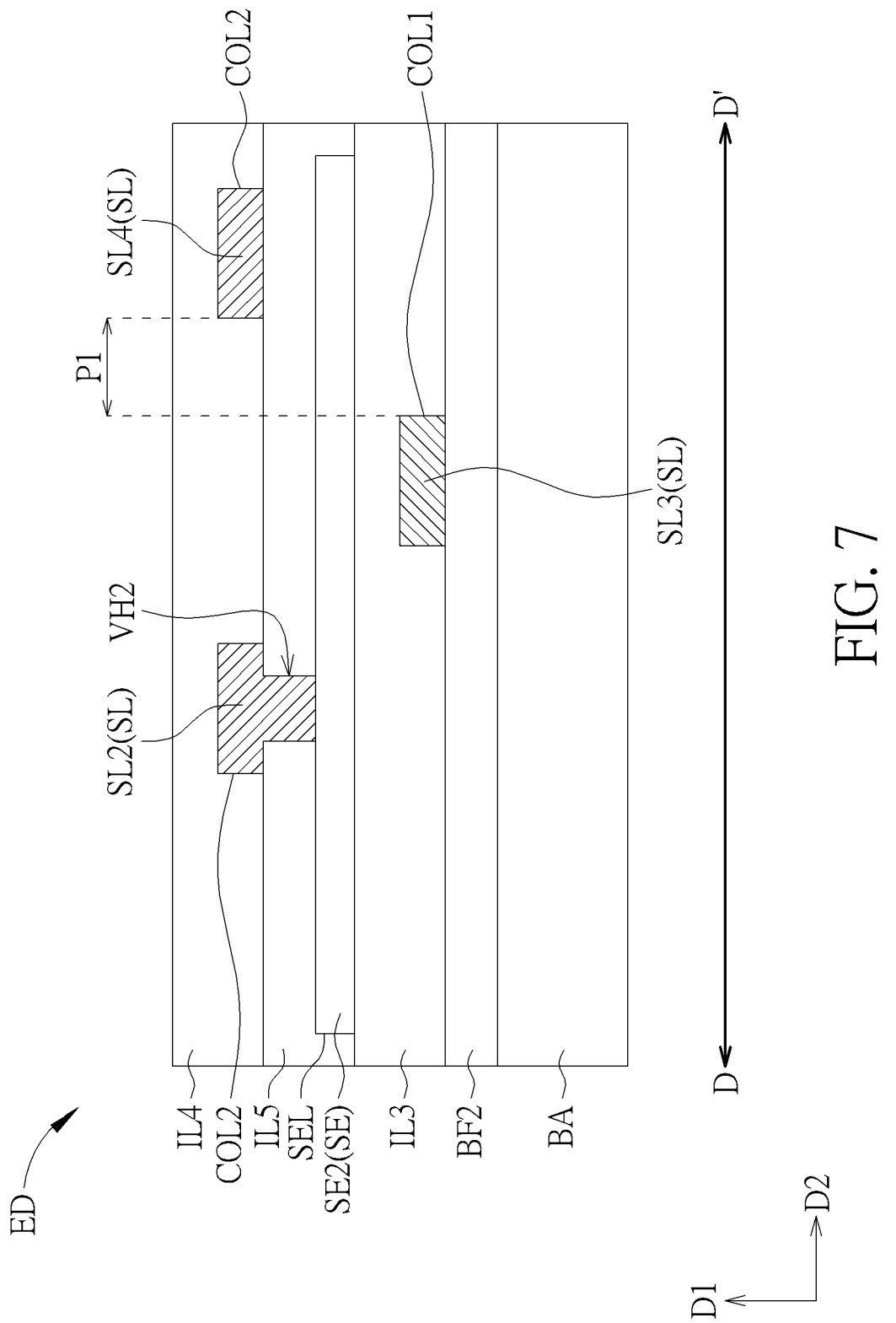
FIG. 7 schematically illustrates a cross-sectional view of the electronic device according to the third embodiment of the present disclosure along a sectional line D-D'.

Referring to FIG. 5 to FIG. 7, FIG. 5 schematically illustrates a top view of an electronic device according to a third embodiment of the present disclosure, FIG. 6 schematically illustrates a cross-sectional view of the electronic device according to the third embodiment of the present disclosure along a sectional line C-C', and FIG. 7 schematically illustrates a cross-sectional view of the electronic device according to the third embodiment of the present disclosure along a sectional line D-D'. In order to simplify the figure, FIG. 5 only shows the signal lines SL and the sensing electrodes SE, and other elements and layers are omitted. In addition, the base layers BA in FIG. 6 and FIG. 7 are shown as a single layer, and the elements and the layers included in the base layer BA may refer to the contents of the above-mentioned first embodiment, and will not be redundantly described. The material of the signal lines SL and the material of the sensing electrodes SE may refer to the contents of the above-mentioned first embodiment, and will not be redundantly described. One of the main differences between the structures shown in FIG. 5 to FIG. 7 and the structure of the first embodiment shown in FIG. 1 is the disposition positions of the conductive layers and the sensing layer. According to the present embodiment, the electronic device ED may include at least two conductive layers, and at least one of the at least two conductive layers may be disposed on the sensing layer SEL, but not limited thereto. For example, as shown in FIG. 5 to FIG. 7, the electronic device ED may include the conductive layer COL1, the conductive layer COL2 and the sensing layer SEL, the sensing layer SEL includes the sensing electrode SE1, the sensing electrode SE2, the sensing electrode SE3 and the sensing electrode SE4, and the conductive layer COL1 and the conductive layer COL2 include the signal line SL1, the signal line SL2, the signal line SL3 and the signal line SL4 respectively electrically connected to the sensing electrode SE1, the sensing electrode SE2, the sensing electrode SE3 and the sensing electrode SE4. As shown in FIG. 6 and FIG. 7, the conductive layer COL2 may be disposed on the sensing layer SEL, and the sensing layer SEL may be disposed on the conductive layer COL1 in the present embodiment. In other words, the sensing layer SEL may be disposed between the conductive layer COL1 and the conductive layer COL2, but not limited thereto. In the present embodiment, the signal line SL1 and the signal line SL3 may be included in the conductive layer COL1, and the signal line SL2 and the signal line SL4 may be included in the conductive layer COL2, but not limited thereto. That is, the signal line SL1 and the signal line SL3 may be located below the sensing electrodes SE, and the signal line SL2 and the signal line SL4 may be located above the sensing electrodes SE, but not limited thereto. Therefore, as shown in FIG. 6, the signal line SL1 is located below the sensing electrode SE1, a via VH1 may for example be included in the insulating layer IL3, and the sensing electrode SE1 may be filled into the via VH1 to be electrically connected to the signal line SL1, but not limited thereto. Similarly, as shown in FIG. 7, the signal line SL2 is located above the sensing electrode SE2, a via VH2 may for example be included in the insulating layer IL5, and the signal line SL2 may be filled into the via VH2 to be electrically connected to the sensing electrode SE2, but not limited thereto. Although it is not shown in the figure, the signal line SL3 and the signal line SL4 may be electrically connected to the sensing electrode SE3 and the sensing electrode SE4 respectively through the above-mentioned method in the present embodiment, and will not be redundantly described. The above-mentioned electrical connection way of the signal lines SL and the sensing electrodes SE may be applied to each of the embodiments and variant embodiments of the present disclosure, and will not be redundantly described. In addition, the electrical connection way of the present embodiment mentioning that the signal lines SL are electrically connected to the sensing electrodes SE through the vias is just exemplary, and the present disclosure is not limited thereto. In some embodiments, the signal lines SL may be electrically connected to the sensing electrodes SE in any suitable way according to the demands of the design.

Since the signal lines SL may be disposed in different conductive layers in the present embodiment, the interference between the signal lines SL occurred due to the reduce of the spacing of the signal lines SL in the top view direction may be reduced, thereby improving the flexibility of spatial configuration of the electronic device ED. For example, as shown in FIG. 6 and FIG. 7, the signal line SL1 located in the conductive layer COL1 and the corresponding signal line SL2 located in the conductive layer COL2 may for example have the spacing P1 in the top view direction (direction D1), wherein the spacing P1 may be lower than or equal to 2 micrometers, but not limited thereto. That is, compared with the condition that the signal lines SL are disposed in the same conductive layer, the signal lines SL of the present embodiment may have a lower lateral spacing in the top view direction (direction D1), such that the spatial configuration of the electronic device ED may be improved under the condition that the interference between the signal lines SL is reduced, or the number of the signal lines SL disposed in the electronic device ED may be increased, but not limited thereto.

Figure 8:
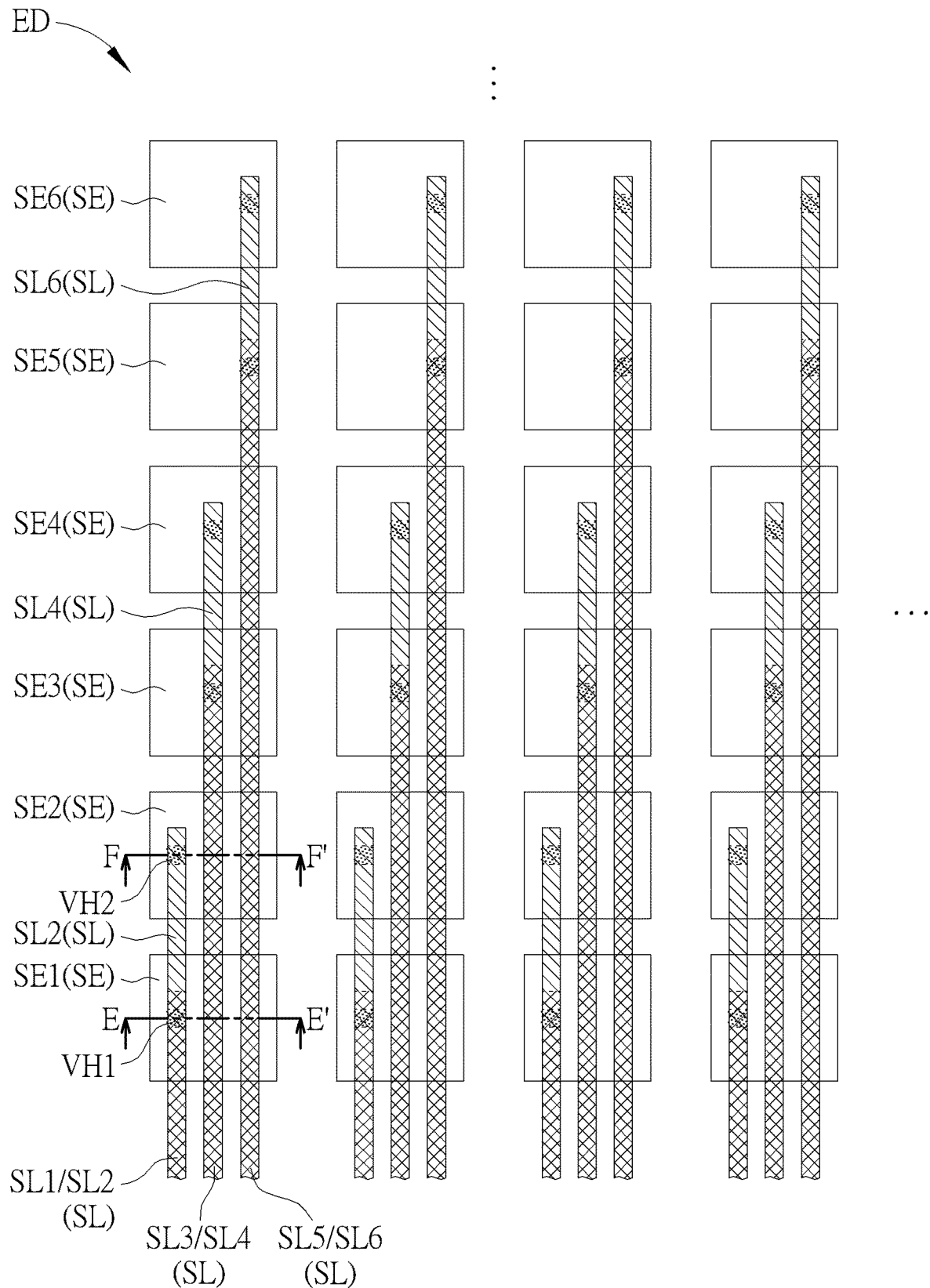
FIG. 8 schematically illustrates a top view of an electronic device according to a fourth embodiment of the present disclosure.
Figure 9:
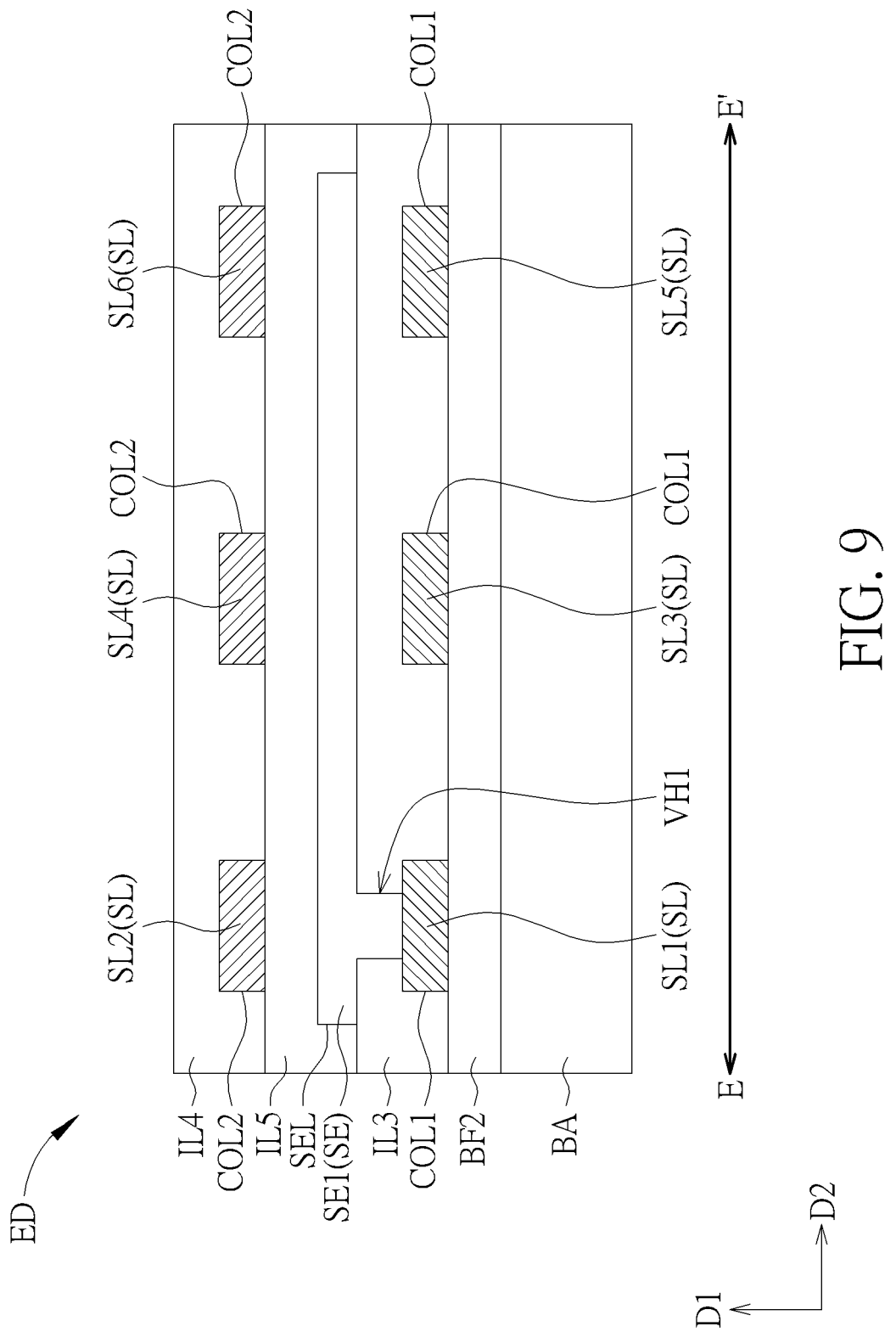
FIG. 9 schematically illustrates a cross-sectional view of the electronic device according to the fourth embodiment of the present disclosure along a sectional line E-E'.
Figure 10:
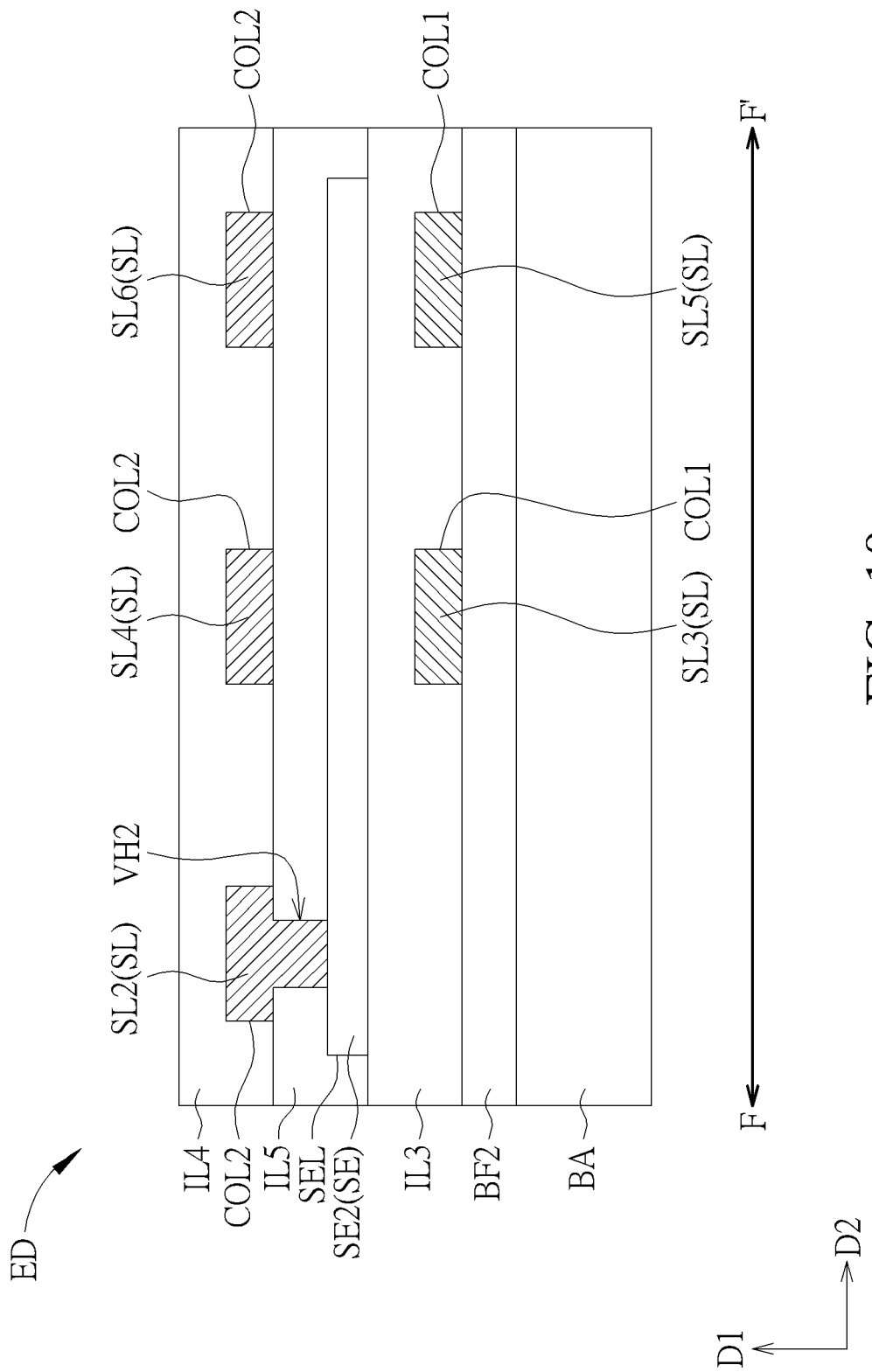
FIG. 10 schematically illustrates a cross-sectional view of the electronic device according to the fourth embodiment of the present disclosure along a sectional line F-F'.

Referring to FIG. 8 to FIG. 10, FIG. 8 schematically illustrates a top view of an electronic device according to a fourth embodiment of the present disclosure, FIG. 9 schematically illustrates a cross-sectional view of the electronic device according to the fourth embodiment of the present disclosure along a sectional line E-E', and FIG. 10 schematically illustrates a cross-sectional view of the electronic device according to the fourth embodiment of the present disclosure along a sectional line F-F'. In order to simplify the figure, FIG. 8 only shows the signal lines SL and the sensing electrodes SE, and other elements and layers are omitted. In addition, the base layers BA in FIG. 9 and FIG. 10 are shown as a single layer, and the elements and the layers included in the base layer BA may refer to the contents of the above-mentioned first embodiment, and will not be redundantly described. The material of the signal lines SL and the material of the sensing electrodes SE may refer to the contents of the above-mentioned first embodiment, and will not be redundantly described. One of the main differences between the structures shown in FIG. 8 to FIG. 10 and the structure of the second embodiment shown in FIG. 3 is the disposition positions of the conductive layers and the sensing layer. According to the present embodiment, as shown in FIG. 8 to FIG. 10, the electronic device ED may include the conductive layer COL1, the conductive layer COL2 and the sensing layer SEL, the sensing layer SEL includes the sensing electrode SE1, the sensing electrode SE2, the sensing electrode SE3, the sensing electrode SE4, the sensing electrode SE5 and the sensing electrode SE6, and the conductive layer COL1 and the conductive layer COL2 include the signal line SL1, the signal line SL2, the signal line SL3, the signal line SL4, the signal line SL5 and the signal line SL6 respectively electrically connected to the sensing electrode SE1, the sensing electrode SE2, the sensing electrode SE3, the sensing electrode SE4, the sensing electrode SE5 and the sensing electrode SE6. As shown in FIG. 9 and FIG. 10, the conductive layer COL2 may be disposed on the sensing layer SEL, and the sensing layer SEL may be disposed on the conductive layer COL1 in the present embodiment, but not limited thereto. In the present embodiment, the conductive layer COL1 may include the signal line SL1, the signal line SL3 and the signal line SL5, and the conductive layer COL2 may include the signal line SL2, the signal line SL4 and the signal line SL6, but not limited thereto. That is, the signal line SL1, the signal line SL3 and the signal line SL5 may be located below the sensing electrodes SE, and the signal line SL2, the signal line SL4 and the signal line SL6 may be located above the sensing electrodes SE, but not limited thereto. As shown in FIG. 9, the insulating layer IL3 may for example include the via VH1, and the sensing electrode SE1 may be filled into the via VH1 and directly in contact with the signal line SL1 to be electrically connected to the signal line SL1, but not limited thereto. Similarly, as shown in FIG. 10, the insulating layer IL5 may for example include the via VH2, and the signal line SL2 may be filled into the via VH2 and directly in contact with the sensing electrode SE2 to be electrically connected to the sensing electrode SE2, but not limited thereto.

According to the present embodiment, since the signal lines SL may be disposed in different conductive layers, each of the signal lines SL disposed in different conductive layers may be overlapped with the corresponding signal line, thereby improving the spatial configuration of the electronic device ED. For example, as shown in FIG. 9 and FIG. 10, the signal line SL1 may be overlapped with the corresponding signal line SL2, the signal line SL3 may be overlapped with the corresponding signal line SL4, and the signal line SL5 may be overlapped with the corresponding signal line SL6, but not limited thereto. Compared with the condition that the signal lines SL are disposed in the same layer, the disposition way of the signal lines SL of the present embodiment may increase the utilization rate of the space of the electronic device ED, thereby improving the spatial configuration of the electronic device ED. It should be noted that the structures shown in FIG. 9 and FIG. 10 are just exemplary, and the present disclosure is not limited thereto. In some embodiments, each of the signal lines SL located in different conductive layers may be partially overlapped with the corresponding signal line SL.

Figure 11:
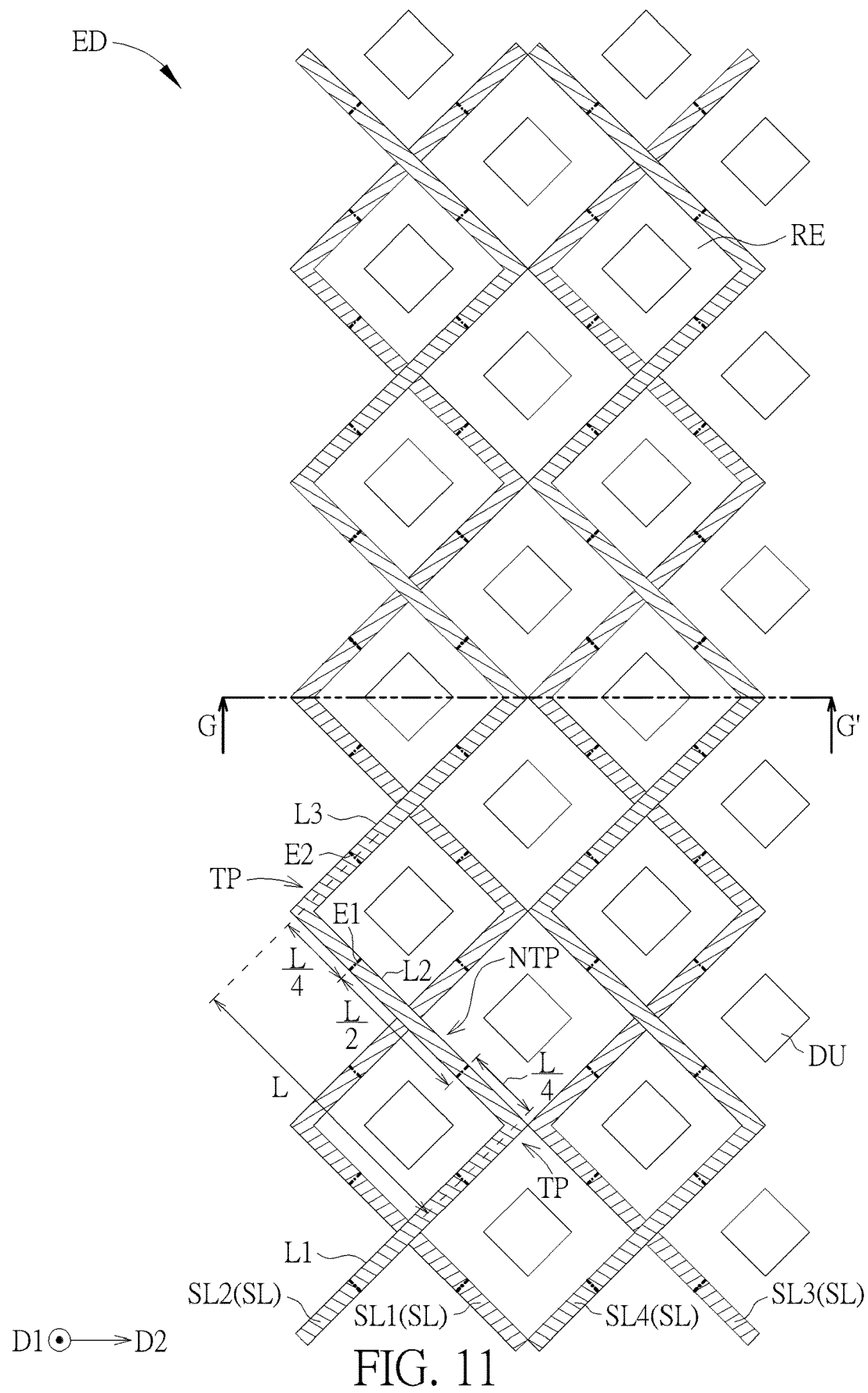
FIG. 11 schematically illustrates a top view of an electronic device according to a fifth embodiment of the present disclosure.
Figure 12:
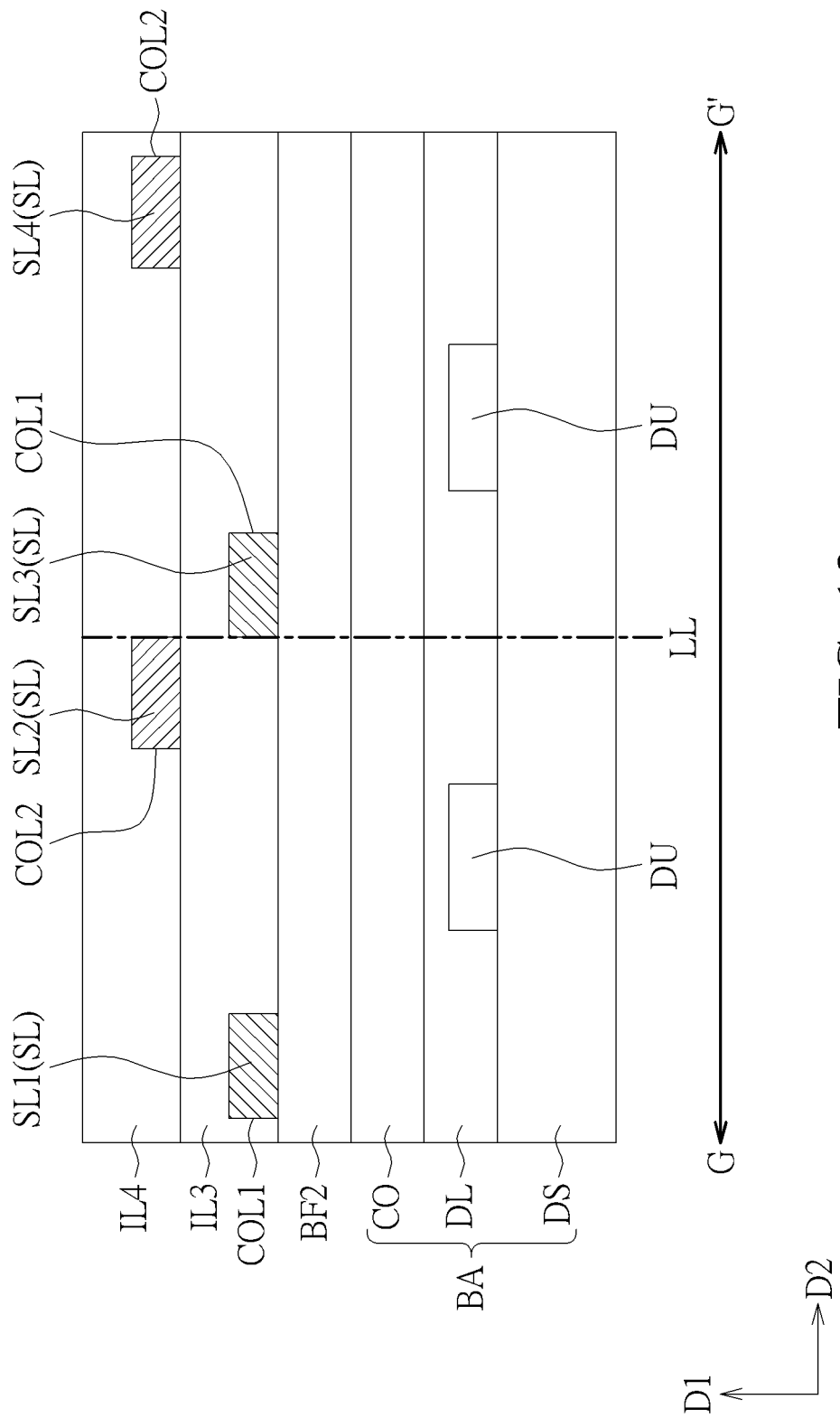
FIG. 12 schematically illustrates a cross-sectional view of the electronic device according to the fifth embodiment of the present disclosure along a sectional line G-G'.

Referring to FIG. 11 and FIG. 12, FIG. 11 schematically illustrates a top view of an electronic device according to a fifth embodiment of the present disclosure, and FIG. 12 schematically illustrates a cross-sectional view of the electronic device according to the fifth embodiment of the present disclosure along a sectional line G-G'. In order to simplify the figure, FIG. 11 only shows the signal lines SL and the light emitting units DU, and other elements and layers are omitted. In addition, the sensing layer SEL is omitted in FIG. 12, and the base layer BA of the electronic device ED is simply shown as a three-layer structure, wherein the base layer BA shown in FIG. 12 may include a display substrate DS, a display layer DL and a cover layer CO. The display substrate DS may for example include any suitable layer or element located below the light emitting units DU, such as the substrate SB and the circuit layer CL mentioned above, but not limited thereto. The display layer DL may for example include the light emitting units DU, but not limited thereto. The cover layer CO may for example include any suitable layer or element located above the light emitting units DU, such as the encapsulation layer EN mentioned above, but not limited thereto. The elements or the layers in the base layer BA mentioned above may refer to the contents of the first embodiment, and will not be redundantly described. One of the main differences between the structures shown in FIG. 11 and FIG. 12 and the structure of the first embodiment shown in FIG. 1 is the design of the signal lines. According to the present embodiment, the signal lines SL of the electronic device ED may for example include non-linear patterns, such as a zigzag pattern, but not limited thereto. In detail, as shown in FIG. 11 and FIG. 12, the electronic device ED may include the signal line SL1, the signal line SL2, the signal line SL3 and the signal line SL4, wherein the signal line SL1 and the signal line SL3 may be included in the conductive layer COL1, and the signal line SL2 and the signal line SL4 may be included in the conductive layer COL2, but not limited thereto. It should be noted that although the sensing layer is not shown in FIG. 12, the electronic device ED of the present embodiment may include the sensing layer, wherein the disposition relationship between the sensing layer, the conductive layer COL1 and the conductive layer COL2 may refer to the contents of the above-mentioned embodiments and variant embodiments. For example, the sensing layer may be disposed between the conductive layer COL1 and the conductive layer COL2 in the present embodiment, or the sensing layer may be disposed on the conductive layer COL1 and the conductive layer COL2, but not limited thereto. The signal line SL1, the signal line SL2, the signal line SL3 and the signal line SL4 may be respectively electrically connected to the sensing electrodes disposed in the sensing layer, but not limited thereto. According to the present embodiment, the signal line SL1, the signal line SL2, the signal line SL3 and the signal line SL4 may for example be zigzag-patterned, but not limited thereto. In some embodiments, the signal lines SL may include other suitable non-linear patterns, such as an arc, irregular patterns or the combinations of the above-mentioned patterns, but not limited thereto. In the present embodiment, since the signal lines SL may be disposed in different conductive layers, the signal lines SL located indifferent conductive layers may be overlapped with each other, or in other words, the signal lines in one of the conductive layer COL1 and the conductive layer COL2 may be overlapped with the corresponding signal lines SL in another one of the conductive layer COL1 and the conductive layer COL2, but not limited thereto. In detail, as shown in FIG. 11, each of the signal lines SL may include turning portions TP and non-turning portions NTP in the present embodiment, and the turning portion TP may be arc-shaped or sharp, wherein the signal line SL1 and/or the signal line SL3 located in the conductive layer COL1 may respectively be overlapped or intersected with the signal line SL2 and/or the signal line SL4 located in the conductive layer COL2 in the direction D1 (that is, the top view direction) at the non-turning portions NTP, or in other words, the non-turning portions NTP of the signal line SL1 and/or the signal line SL3 may be overlapped or intersected with the non-turning portions NTP of the signal line SL2 and/or the signal line SL4, but not limited thereto. In addition, as shown in FIG. 11, the turning portions TP of any one of the signal lines SL may not be overlapped with the turning portions TP of other signal lines SL, but not limited thereto. It should be noted that "the turning portions TP and the non-turning portions NTP of the signal lines SL" mentioned above may for example be defined through the length and the position of the line segment of the signal lines SL in the present embodiment. In detail, as shown in FIG. 11, each of the signal lines SL may include a plurality of turning points, wherein a line segment of the signal line SL may be included between two adjacent turning points (for example, as shown in FIG. 11, the signal line SL2 may include a line segment L1, a line segment L2 and a line segment L3), and the length of a line segment may for example be defined as the distance between the centers of two line segments which are adjacent to the line segment. For example, the length L of the line segment L2 shown in FIG. 11 may be the distance between the centers of the line segment L3 and the line segment L1 which are adjacent to the line segment L2, but not limited thereto. In some embodiments, different line segments of a signal line SL may have the same length, but not limited thereto. In some embodiments, different line segments of a signal line SL may have different lengths. After the length of the segment is defined, the turning portions TP and the non-turning portions NTP of the signal lines SL may be defined. In detail, in the present embodiment, the distances between the center of the line segment and the two ends of the turning portion TP may respectively be a quarter of the length of the line segment. Therefore, the positions of the two ends of the turning portion TP may be defined, thereby defining the range of the turning portions TP, but not limited thereto. For example, as shown in FIG. 11, the distance between an end (such as the end E1) of the turning portion TP of the signal line SL2 and the center of the line segment L3 may be a quarter of the length of the line segment L2, the distance between another end (such as the end E2) of the turning portion TP and the center of the line segment L2 (not shown in FIG. 11) may be a quarter of the length of the line segment L3, and the portion of the signal line SL2 located between the end E1 and the end E2 may be defined as the turning portion TP of the signal line SL2, but not limited thereto. In the present embodiment, in each of the line segments of the signal lines SL, the length of the turning portion TP and the length of the non-turning portion NTP may for example be a half of the length of the line segment. For example, as shown in FIG. 11, in the line segment L2, the length of the turning portion TP (L/4+L/4) and the length of the non-turning portion NTP (L/2) may be the same, but not limited thereto.

In addition, the signal lines SL in one of the conductive layers may not be overlapped with the signal lines SL in another one of the conductive layer, and the signal lines SL in one of the conductive layers may be aligned with the signal lines SL in another one of the conductive layer, but not limited thereto. In detail, as shown in FIG. 11 and FIG. 12, the signal line SL2 in the conductive layer COL2 may not be overlapped with the signal line SL3 in the conductive layer COL1 in the direction D1, and the signal line SL2 may be aligned with the signal line SL3 in the first direction D1, for example, the signal line SL2 and the signal line SL3 may be aligned with the sectional line LL shown in FIG. 12, but not limited thereto. It can be seen from FIG. 11 and FIG. 12 that the signal line SL3 and the signal line SL2 may be aligned with each other at their turning portions, but not limited thereto. In some embodiments, the signal line SL2 and the signal line SL3 may not be aligned with each other in the direction D1, and a spacing may be included between the signal line SL2 and the signal line SL3, wherein the range of the spacing may for example refer to the spacing P1 of the above-mentioned first embodiment, but not limited thereto. As mentioned above, since the signal lines SL may be disposed in different conductive layers in the present embodiment, the signal lines SL located in different conductive layers may be overlapped or aligned with each other, or a lower spacing may be included between the signal lines SL, such that the utilization rate of the space of the electronic device ED may be increased, thereby improving the spatial configuration of the electronic device or increasing the number of the signal lines SL disposed in the electronic device ED. In addition, since the signal lines which are overlapped or aligned with each other may be disposed in different conductive layers in the present embodiment, the interference between the signal lines SL due to the reduce of the spacing between the signal lines SL may be reduced, but not limited thereto.

In addition, the signal lines SL of the electronic device ED may not be overlapped with the light emitting units DU in the top view direction, but not limited thereto. For example, as shown in FIG. 11, the light emitting units DU of the present embodiment may for example be arranged in a pentile array, and the signal lines SL may for example be arranged and form a plurality of regions RE in the top view direction (direction D1) of the electronic device ED, wherein each of the light emitting units DU may for example be disposed in the region RE, such that the signal lines SL may not be overlapped with the light emitting units DU in the top view direction (direction D1) of the electronic device ED, but not limited thereto. Since the signal lines SL are not overlapped with the light emitting units DU in the direction D1, the effect of the signal lines SL on the display of the electronic device ED may be reduced, but not limited thereto. It should be noted that the feature mentioned in the present embodiment that the signal lines SL may not be overlapped with the light emitting units DU in the top view direction may be applied to each of the embodiments and variant embodiments of the present disclosure, and will not be redundantly described in the following. For example, although the positions of the light emitting units are not shown in the above-mentioned embodiments and related figures, the signal lines SL of the electronic device ED may not be overlapped with the light emitting units DU in the top view direction of the electronic device ED. In addition, the arrangement of the light emitting units DU and the arrangement of the signal lines SL shown in FIG. 11 are just exemplary, and the present disclosure is not limited thereto. In some embodiments, the light emitting units DU and the signal lines SL may be arranged in any suitable way, such that the signal lines SL may not be overlapped with the light emitting units DU in the direction D1.

It should be noted that although the signal lines SL in the present embodiment and the above-mentioned embodiments include the same pattern, the present disclosure is not limited thereto. In some embodiments, the shape of one of the signal lines SL and the shape of another one of the signal lines SL may be different, For example, when one of the signal lines SL includes the zigzag pattern shown in FIG. 11, another one of the signal lines SL may for example include the linear pattern shown in FIG. 1, but the present disclosure is not limited thereto. The above-mentioned feature that the signal lines SL may include different patterns may be applied to each of the embodiments and variant embodiments of the present disclosure, and will not be redundantly described in the following.

Figure 13:
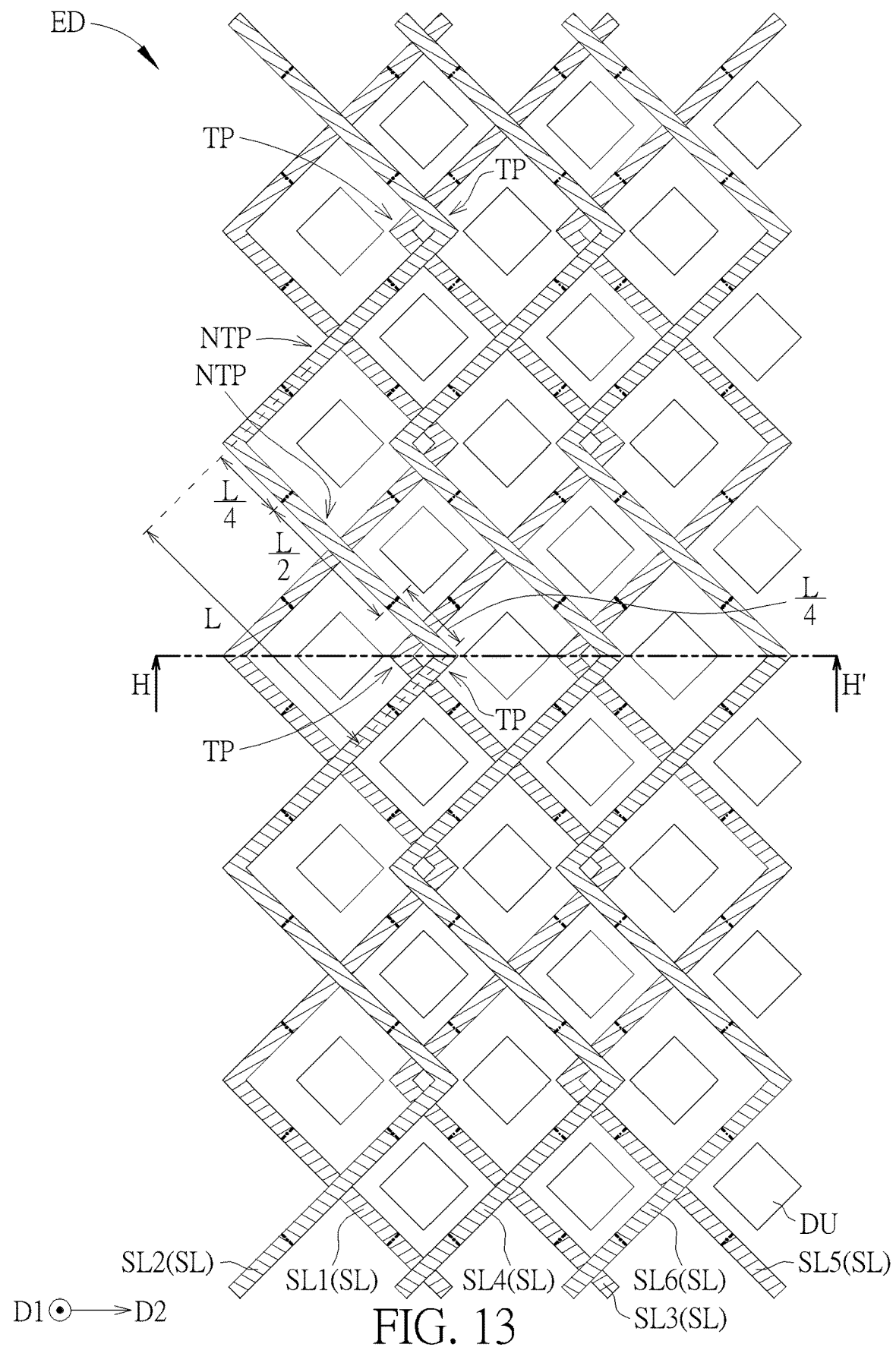
FIG. 13 schematically illustrates a top view of an electronic device according to a sixth embodiment of the present disclosure.
Figure 14:
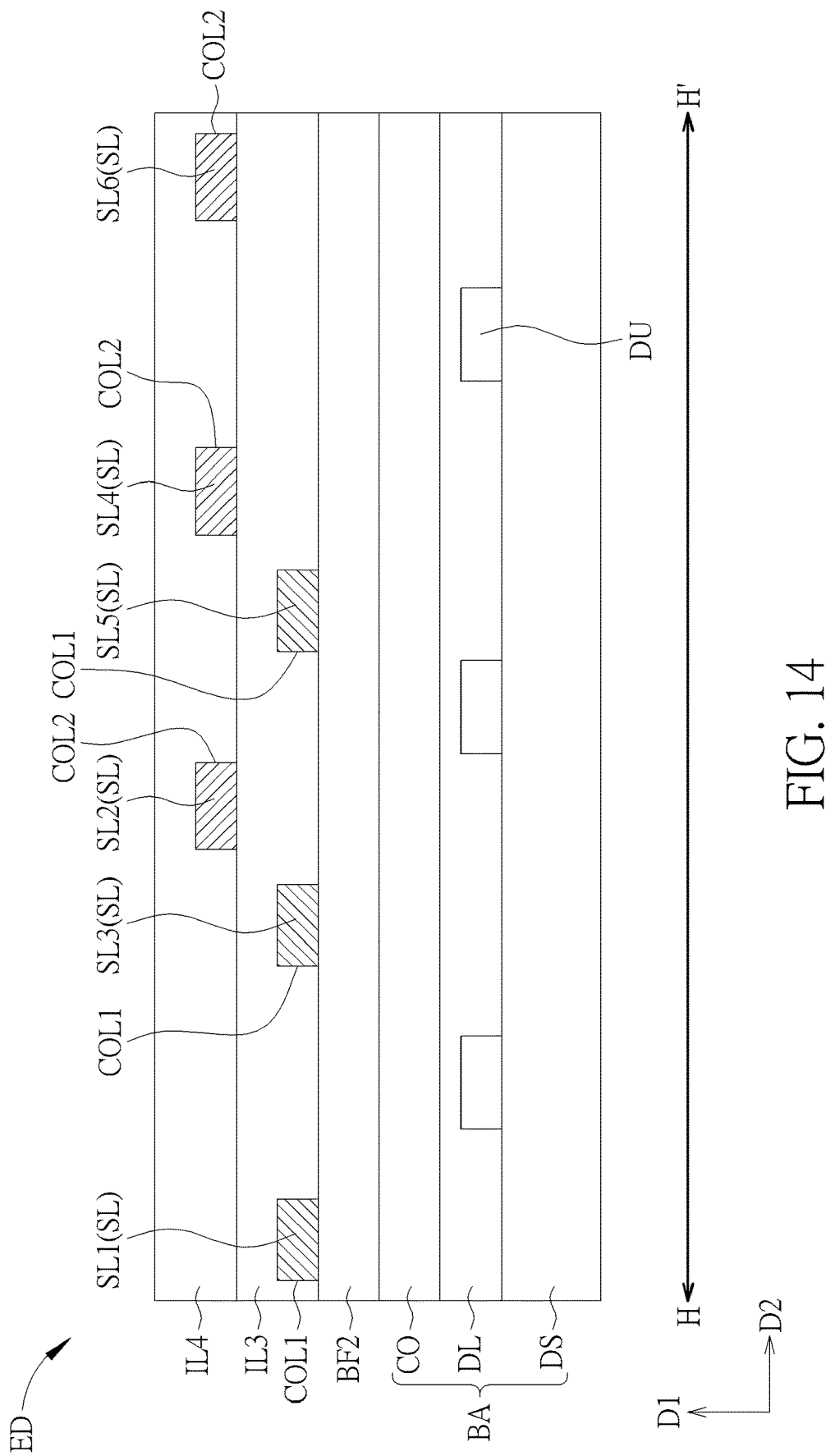
FIG. 14 schematically illustrates a cross-sectional view of the electronic device according to the sixth embodiment of the present disclosure along a sectional line H-H'.

Referring to FIG. 13 and FIG. 14, FIG. 13 schematically illustrates a top view of an electronic device according to a sixth embodiment of the present disclosure, and FIG. 14 schematically illustrates a cross-sectional view of the electronic device according to the sixth embodiment of the present disclosure along a sectional line H-H'. In order to simplify the figure, FIG. 13 only shows the signal lines SL and the light emitting units DU, and other elements and layers are omitted. In addition, the sensing layer SEL is omitted in FIG. 14, and the base layer BA of the electronic device ED is simply shown as a three-layer structure. The elements or the layers included in the base layer BA shown in FIG. 14 may refer to the descriptions related to FIG. 13 and the contents of the above-mentioned first embodiment, and will not be redundantly described. One of the main differences between the structures shown in FIG. 13 and FIG. 14 and the structures of the fifth embodiment shown in FIG. 11 and FIG. 12 is the design of the signal lines. As shown in FIG. 13 and FIG. 14, the electronic device ED may for example include the conductive layer COL1 and the conductive layer COL2, the conductive layer COL1 and the conductive layer COL2 may include the signal line SL1, the signal line SL2, the signal line SL3, the signal line SL4, the signal line SL5 and the signal line SL6, wherein the signal line SL1, the signal line SL3 and the signal line SL5 may be included in the conductive layer COL1, and the signal line SL2, the signal line SL4 and the signal line SL6 may be included in the conductive layer COL2, but not limited thereto. According to the present embodiment, the electronic device ED may include at least two conductive layers, and the signal lines SL in one of the conductive layers may be overlapped with the corresponding signal lines SL in another one of the conductive layers at the turning portions TP of the signal lines SL, but not limited thereto. In detail, the signal lines SL located in the conductive layer COL2 may for example extend through the turning portions TP of the signal lines SL located in the conductive layer COL1 in the top view direction (direction D1) of the electronic device ED, such that the signal lines SL located in the conductive layer COL2 may be overlapped or intersected with the signal lines SL located in the conductive layer COL1 at the turning portions TP, or in other words, the turning portions TP of the signal lines SL located in the conductive layer COL2 may be overlapped with the turning portions TP of the signal lines SL located in the conductive layer COL1, but not limited thereto. For example, as shown in FIG. 13, the signal line SL4 located in the conductive layer COL2 may extend through the turning portions TP of the signal line SL1 located in the conductive layer COL1, such that the signal line SL4 may be overlapped with the signal line SL1 at the turning portions TP, but not limited thereto. It should be noted that the signal lines SL located in the conductive layer COL1 may be overlapped with the signal lines SL located in the conductive layer COL2 at the non-turning portions NTP in the present embodiment. For example, as shown in FIG. 13, the signal line SL1 located in the conductive layer COL1 may be overlapped with the signal line SL2 located in the conductive layer COL2 at the non-turning portions NTP, but not limited thereto. According to the present embodiment, since the signal lines SL of the electronic device ED may be disposed in different conductive layers, the signal lines located in different conductive layers may be overlapped with each other, such that the utilization rate of the space of the electronic device ED may be increased, thereby improving the spatial configuration of the electronic device ED or increasing the number of the signal lines SL disposed in the electronic device ED. In addition, since the signal lines SL which are overlapped with each other may be disposed indifferent conductive layers, the interference between the signal lines due to the reduce of the spacing between the signal lines may be reduced.

Figure 15:
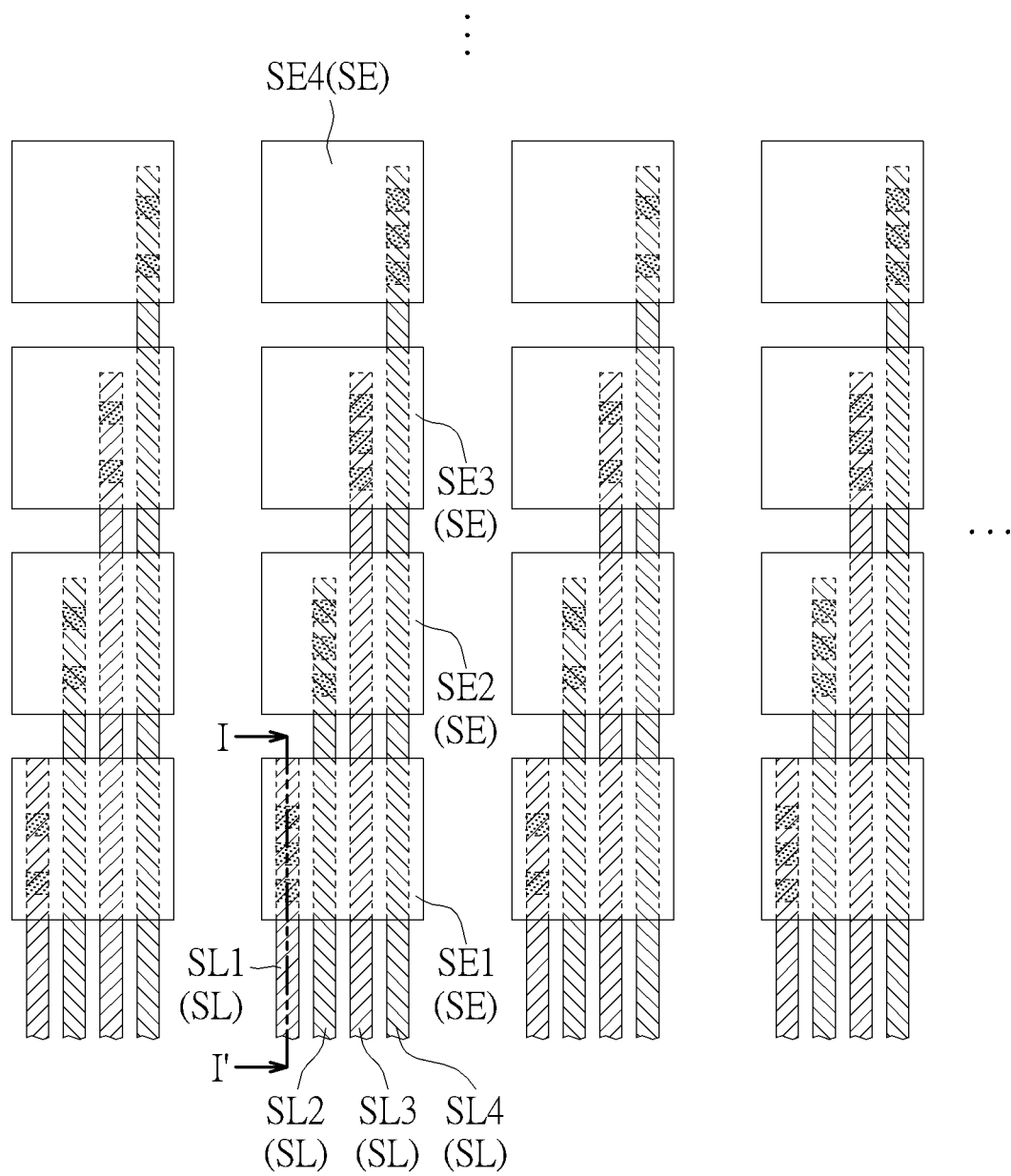
FIG. 15 schematically illustrates a top view of an electronic device according to a seventh embodiment of the present disclosure.
Figure 16:
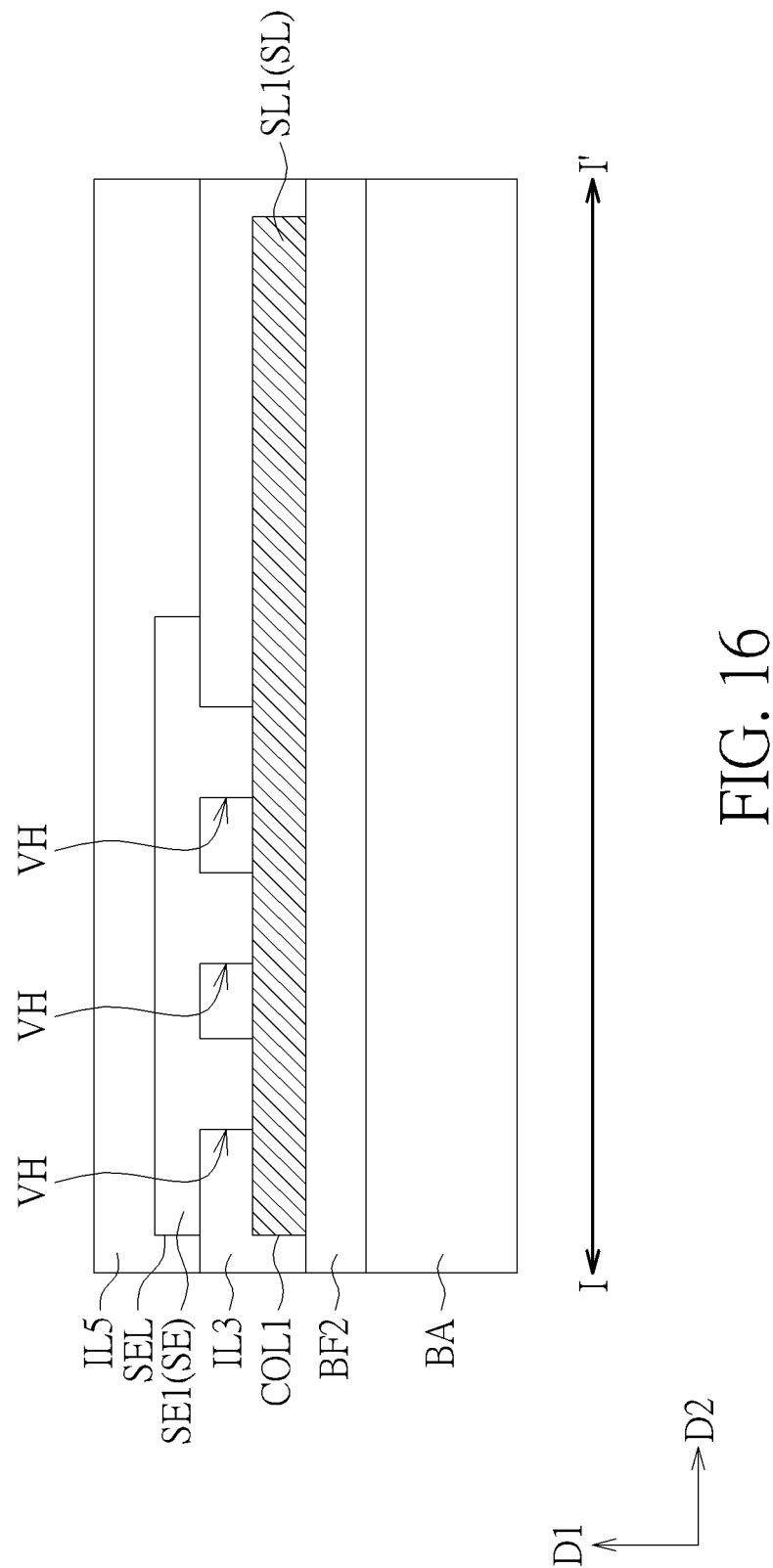
FIG. 16 schematically illustrates a cross-sectional view of the electronic device according to the seventh embodiment of the present disclosure along a sectional line I-I'.

Referring to FIG. 15 and FIG. 16, FIG. 15 schematically illustrates a top view of an electronic device according to a seventh embodiment of the present disclosure, and FIG. 16 schematically illustrates a cross-sectional view of the electronic device according to the seventh embodiment of the present disclosure along a sectional line I-I'. In order to simplify the figure, FIG. 15 only shows the signal lines SL and the sensing electrodes SE, and other elements and layers are omitted. In addition, the base layers BA in FIG. 16 is shown as a single layer, wherein the elements or the layers included in the base layer BA may refer to the contents of the above-mentioned embodiments and variant embodiments, and will not be redundantly described. According to the present embodiment, the signal lines SL of the electronic device ED may respectively be electrically connected to the corresponding sensing electrodes SE through the plurality of vias, but not limited thereto. For example, as shown in FIG. 15 and FIG. 16, the electronic device ED of the present embodiment may for example include the sensing electrode SE1, the sensing electrode SE2, the sensing electrode SE3, the sensing electrode SE4 and the signal line SL1, the signal line SL2, the signal line SL3 and the signal line SL4 respectively electrically connected to the sensing electrode SE1, the sensing electrode SE2, the sensing electrode SE3 and the sensing electrode SE4, wherein the signal line SL1 may be electrically connected to the sensing electrode SE1 through three vias VH, but not limited thereto. As shown in FIG. 16, since the signal line SL1 is disposed in the conductive layer COL1 in the present embodiment, and the conductive layer COL1 is disposed below the sensing layer SEL, the vias VH may for example be disposed in the insulating layer IL3, and the sensing electrode SE1 located in the sensing layer SEL may be filled into the three vias VH and electrically connected to the signal line SL1, but not limited thereto. According to the present embodiment, since the signal lines SL may be electrically connected to the corresponding sensing electrodes SE through more than one vias, the contact impedance between the signal lines SL and the sensing electrodes SE may be reduced, thereby improving the performance of the electronic device ED, but not limited thereto. In addition, different signal lines may be electrically connected to the corresponding sensing electrodes SE through different numbers of the vias in the present embodiment. For example, as shown in FIG. 15, the signal lines at the left side of FIG. 15 may be electrically connected to the corresponding sensing electrodes through two vias, but not limited thereto. The feature mentioned in the present embodiment that the signal lines SL may be electrically connected to the sensing electrodes SE through the plurality of vias may be applied to each of the embodiments and variant embodiments of the present disclosure. It should be noted that in the present disclosure, the number of the vias between the signal lines SL and the sensing electrodes SE is not limited to what is shown in FIG. 15, and any suitable number of the vias may be included between the signal lines SL and the sensing electrodes SE according to the demands of the design.

Figure 17:
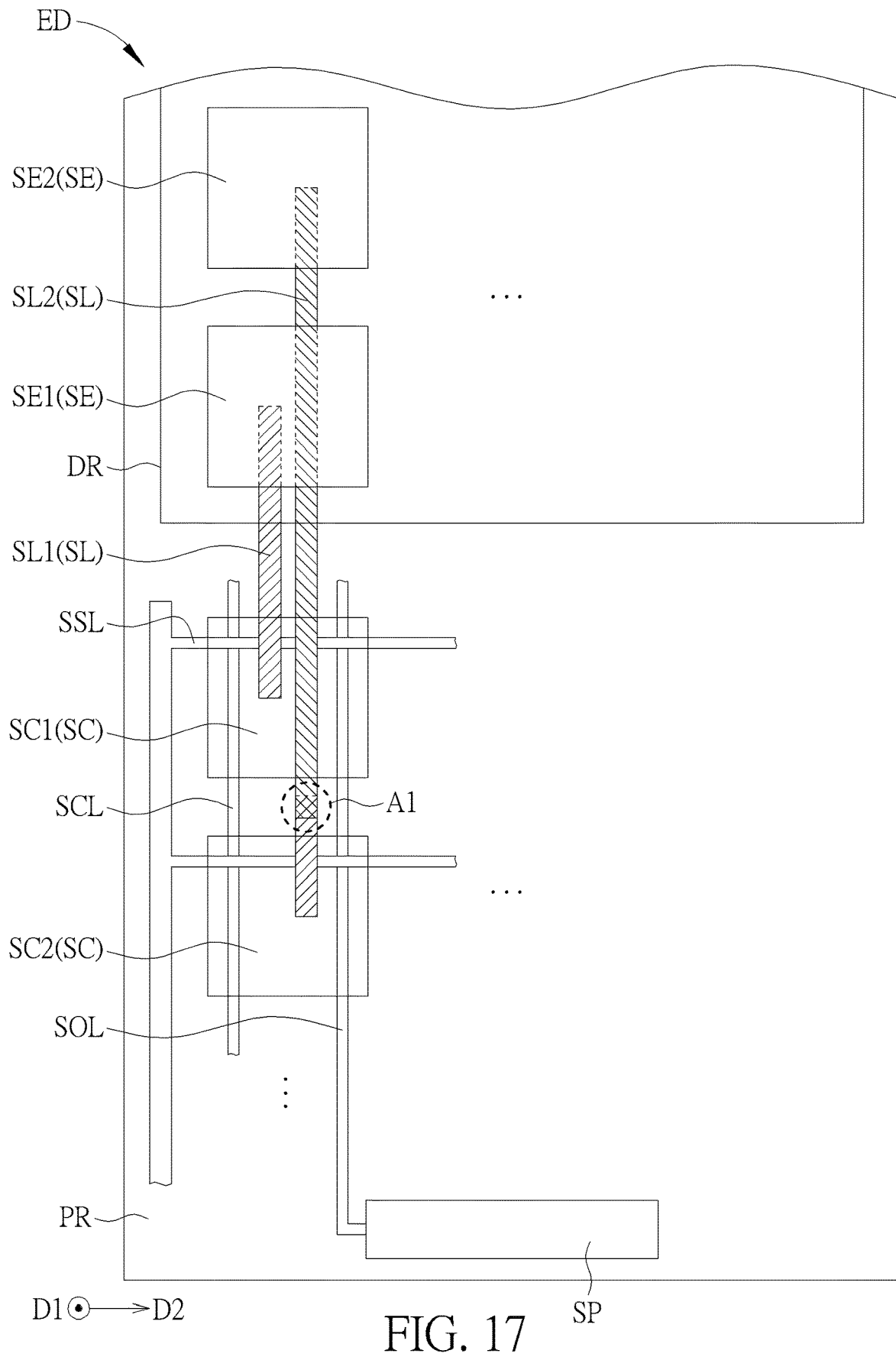
FIG. 17 schematically illustrates a top view of an electronic device according to an eighth embodiment of the present disclosure.
Figure 18:
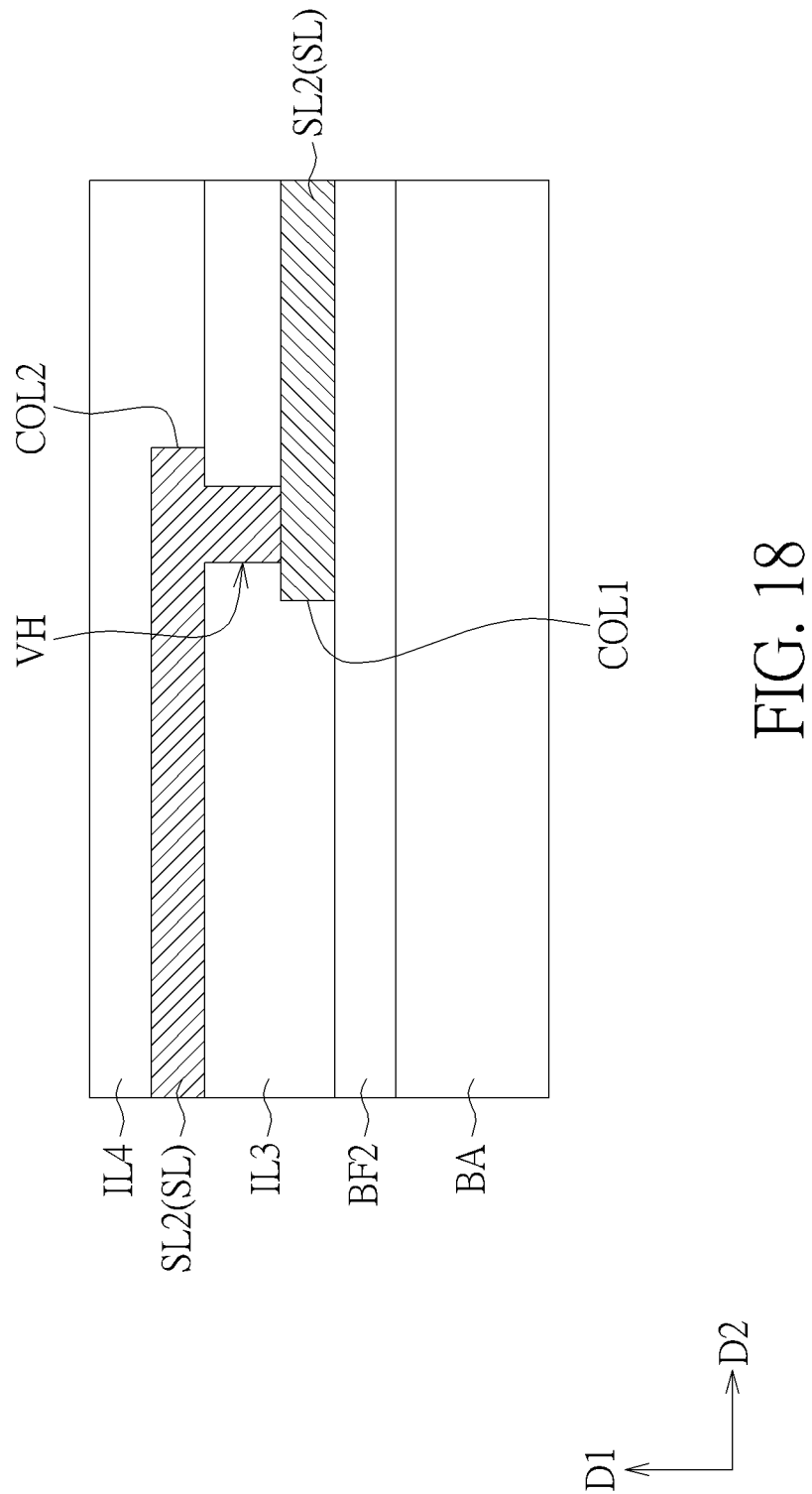
FIG. 18 schematically illustrates a partial-enlarged cross-sectional view of the electronic device according to the eighth embodiment of the present disclosure.

Referring to FIG. 17 and FIG. 18, FIG. 17 schematically illustrates a top view of an electronic device according to an eighth embodiment of the present disclosure, and FIG. 18 schematically illustrates a partial-enlarged cross-sectional view of the electronic device according to the eighth embodiment of the present disclosure. In order to simplify the figure, FIG. 17 shows a portion of the electronic device ED (for example, the lower half of the electronic device ED shown in FIG. 1). In addition, the sensing layer is omitted in FIG. 18, and the base layer BA is shown as a single layer, but not limited thereto. As shown in FIG. 17 and FIG. 18, the electronic device ED may for example include the sensing electrode SE1, the sensing electrode SE2, the signal line SL1 and the signal line SL2 respectively electrically connected to the sensing electrode SE1 and the sensing electrode SE2, and the sensing circuit SC1 and the sensing circuit SC2 respectively electrically connected to the signal line SL1 and the signal line SL2, wherein the sensing electrode SE1 and the sensing electrode SE2 may be disposed in the sensing layer (not shown in FIG. 17 and FIG. 18), the signal line SL1 may be included in the conductive layer COL1 (not shown in FIG. 18), and the signal line SL2 may be included in the conductive layer COL2, but not limited thereto. As mentioned above, the sensing electrodes SE of the present embodiment may for example serve as touch elements or fingerprint identification elements, such as capacitive touch elements or capacitive fingerprint identification elements. The signal lines SL electrically connected to the sensing electrodes SE may for example transmit the signals detected by the sensing electrodes SE to the sensing circuits SC located in the peripheral region PR, the sensing circuits SC may output the corresponding signals to the sensing processor SP according to the signals received, and the sensing processor SP may process the signals to obtain the information of the touch position or the pattern of the fingerprint, but not limited thereto. For example, as shown in FIG. 17, the sensing circuits SC may include sensing scan lines SSL, sensing common lines SCL and sensing output lines SOL, wherein the sensing common lines SCL may be electrically connected to a reference voltage or a common voltage, but not limited thereto. The sensing scan lines SSL, the sensing common lines SCL and the sensing output lines SOL may for example include any suitable conductive material such as metal materials, but not limited thereto. According to the present embodiment, the sensing electrodes SE may transmit the capacitance signals to the corresponding sensing circuits SC through the signal lines SL, the corresponding sensing circuits SC may transmit the corresponding output signals to the sensing processor SP through the sensing output lines SOL after the corresponding sensing circuits SC receive the signals from the sensing electrodes SE, and the signals may be processed by the sensing processor SP. For example, when the object does not touch the surface of the electronic device ED, the sensing electrodes SE may for example transmit constant signals to the corresponding sensing circuits SC through the signal lines SL, such that the sensing circuits SC may output constant signals to the sensing processor SP through the sensing output lines SOL; and when the object touches the surface of the electronic device ED, the capacitance value detected by the sensing electrode SE corresponding to the contact position of the object may be changed, such that the capacitance signals transmitted from the sensing electrode SE to the corresponding sensing circuit SC would be changed accordingly, thereby changing the signals transmitted to the sensing processor SP, and the information of the touch position may be obtained after the signals are processed, but not limited thereto. In addition, when the resolution and/or the density of the sensing electrodes SE are high, since the ridges and the valleys of the finger would make the capacitance values detected by the sensing electrodes SE different, such that the signals transmitted to the sensing circuits SC and the sensing processor SP may be different, the pattern of the fingerprint may for example be obtained through the sensing processor SP, thereby achieving the function of fingerprint identification, but not limited thereto.

According to the present embodiment, the signal lines SL electrically connected to the sensing electrodes SE may be disposed in different conductive layers in the electronic device ED, and the signal line SL disposed in one of the conductive layers may be transferred to other conductive layers before it is electrically connected to the corresponding sensing circuit SC, such that all of the signal lines SL may for example be disposed in the same conductive layer, but not limited thereto. In detail, as shown in FIG. 18, the signal line SL2 electrically connected to the sensing electrode SE2 and the sensing circuit SC2 may be disposed in the conductive layer COL2, wherein the conductive layer COL2 may be disposed on the conductive layer COL1 with the signal line SL1 disposed therein. Before the signal line SL2 is electrically connected to the sensing circuit SC2, it can be transferred to the conductive layer COL1, such that the signal line SL1 and the signal line SL2 are located in the conductive layer COL1, but not limited thereto. For example, the signal line SL2 may be transferred to the conductive layer COL1 through the via VH, but not limited thereto. Since the signal lines SL disposed in different conductive layers may for example be located in the same conductive layer (such as the conductive layer COL1) through a transferring process before the signal lines SL are electrically connected to the sensing circuits SC, the wiring design and/or the layout for electrically connecting the signal lines SL to the sensing circuits SC may be simplified.

In other words, although the signal lines SL may be disposed in the conductive layer COL1 and the conductive layer COL2 in the present embodiment, the wirings for electrically connecting the signal lines SL to the sensing circuits SC may for example be disposed in the conductive layer COL1, but not limited thereto. It should be noted that the feature mentioned in the present embodiment that the signal lines SL may be located in the same conductive layer through the transfer of the signal lines SL may be applied to each of the embodiments and variant embodiments of the present disclosure.

In summary, an electronic device including a plurality of sensing electrodes and a plurality of signal lines electrically connected to the corresponding sensing electrodes is provided by the present disclosure. When the resolution and/or the density of the sensing electrodes of the electronic device increase, the number of the signal lines needed would be increased accordingly, such that it is more difficult to dispose the signal lines in the electronic device in a traditional way, or the interference between the signal lines would occur due to the excessive small spacing between the signal lines. However, since the signal lines of the electronic device of the present disclosure may be disposed in different conductive layers, the spacing between the signal lines in the top view direction of the electronic device may be reduced, such that the spatial configuration of the electronic device ED may be improved under the condition that the interference between the signal lines is reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a base layer;
   a sensing layer disposed on the base layer, comprising a plurality of sensing electrodes; and
   at least two conductive layers disposed on the base layer, which respectively comprise a plurality of signal lines with each of the signal lines being electrically connected to one of the sensing electrodes,
   wherein the signal lines in one conductive layer are apart from corresponding ones of the signal lines in the conductive layer(s) different from the one conductive layer at most 2 micrometers in a top view of the electronic device.

2. The electronic device according to claim 1, wherein the sensing layer is disposed on the at least two conductive layers.

3. The electronic device according to claim 1, wherein at least one of the at least two conductive layers is disposed on the sensing layer.

4. The electronic device according to claim 1, wherein the plurality of signal lines are in a zigzag form.

5. The electronic device according to claim 4, wherein the signal lines in the one conductive layer overlap with corresponding ones of the signal lines in the conductive layer(s) different from the one conductive layer at a turning portion.

6. The electronic device according to claim 4, wherein the signal lines in the one conductive layer overlap with corresponding ones of the signal lines in the conductive layer(s) different from the one conductive layer at a non-turning portion.

* * * * *